US010586587B2

(12) United States Patent
Dozaka

(10) Patent No.: US 10,586,587 B2
(45) Date of Patent: Mar. 10, 2020

(54) SEMICONDUCTOR MEMORY DEVICE

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Toshiaki Dozaka, Yokohama Kanagawa (JP)

(73) Assignees: TOSHIBA ELECTRONIC DEVICES & STORAGE CORPORATION, Tokyo (JP); KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/918,280

(22) Filed: Mar. 12, 2018

(65) Prior Publication Data

US 2019/0096471 A1 Mar. 28, 2019

(30) Foreign Application Priority Data

Sep. 28, 2017 (JP) .................................. 2017-188408

(51) Int. Cl.
*G11C 11/4096* (2006.01)
*G11C 11/4094* (2006.01)
(Continued)

(52) U.S. Cl.
CPC .......... *G11C 11/4096* (2013.01); *G11C 11/34* (2013.01); *G11C 11/4074* (2013.01); *G11C 11/4085* (2013.01); *G11C 11/4094* (2013.01); *G11C 16/0416* (2013.01); *G11C 16/3459* (2013.01)

(58) Field of Classification Search
CPC ......... G11C 7/067; G11C 11/24; G11C 11/34; G11C 11/4096
See application file for complete search history.

(56) References Cited

U.S. PATENT DOCUMENTS

2002/0071313 A1* 6/2002 Takano ............... G11C 11/5621
365/185.22
2003/0016552 A1 1/2003 Satomi
(Continued)

FOREIGN PATENT DOCUMENTS

JP 3734726 B2 1/2006
JP 2011014190 A 1/2011
(Continued)

*Primary Examiner* — Amir Zarabian
*Assistant Examiner* — Jay W. Radke
(74) *Attorney, Agent, or Firm* — Holtz, Holtz & Volek PC

(57) ABSTRACT

According to one embodiment, semiconductor memory device includes a first circuit that determines data stored in a memory cell; and a second circuit that controls the first circuit, wherein in a sequence in which the second circuit writes first data in the memory cell, the first circuit generates a first current of a first current value, and determines data stored in the memory cell based on the first current and a second current flowing in the memory cell, and in a sequence in which the second circuit writes second data different from the first data in the memory cell, the first circuit generates a third current of a second current value different from the first current value, and determines data stored in the memory cell based on the third current and the second current.

19 Claims, 24 Drawing Sheets

(51) Int. Cl.
*G11C 11/4074* (2006.01)
*G11C 11/408* (2006.01)
*G11C 16/04* (2006.01)
*G11C 16/34* (2006.01)
*G11C 11/34* (2006.01)

(56) References Cited

U.S. PATENT DOCUMENTS

| | | | |
|---|---|---|---|
| 2008/0056006 A1* | 3/2008 | Jung | G11C 11/5628 365/185.22 |
| 2008/0158971 A1* | 7/2008 | Lee | G11C 16/3418 365/185.17 |
| 2010/0110750 A1 | 5/2010 | Namekawa | |
| 2015/0262627 A1 | 9/2015 | Douzaka | |

FOREIGN PATENT DOCUMENTS

| | | |
|---|---|---|
| JP | 5238458 B2 | 7/2013 |
| JP | 6122801 B2 | 4/2017 |

\* cited by examiner

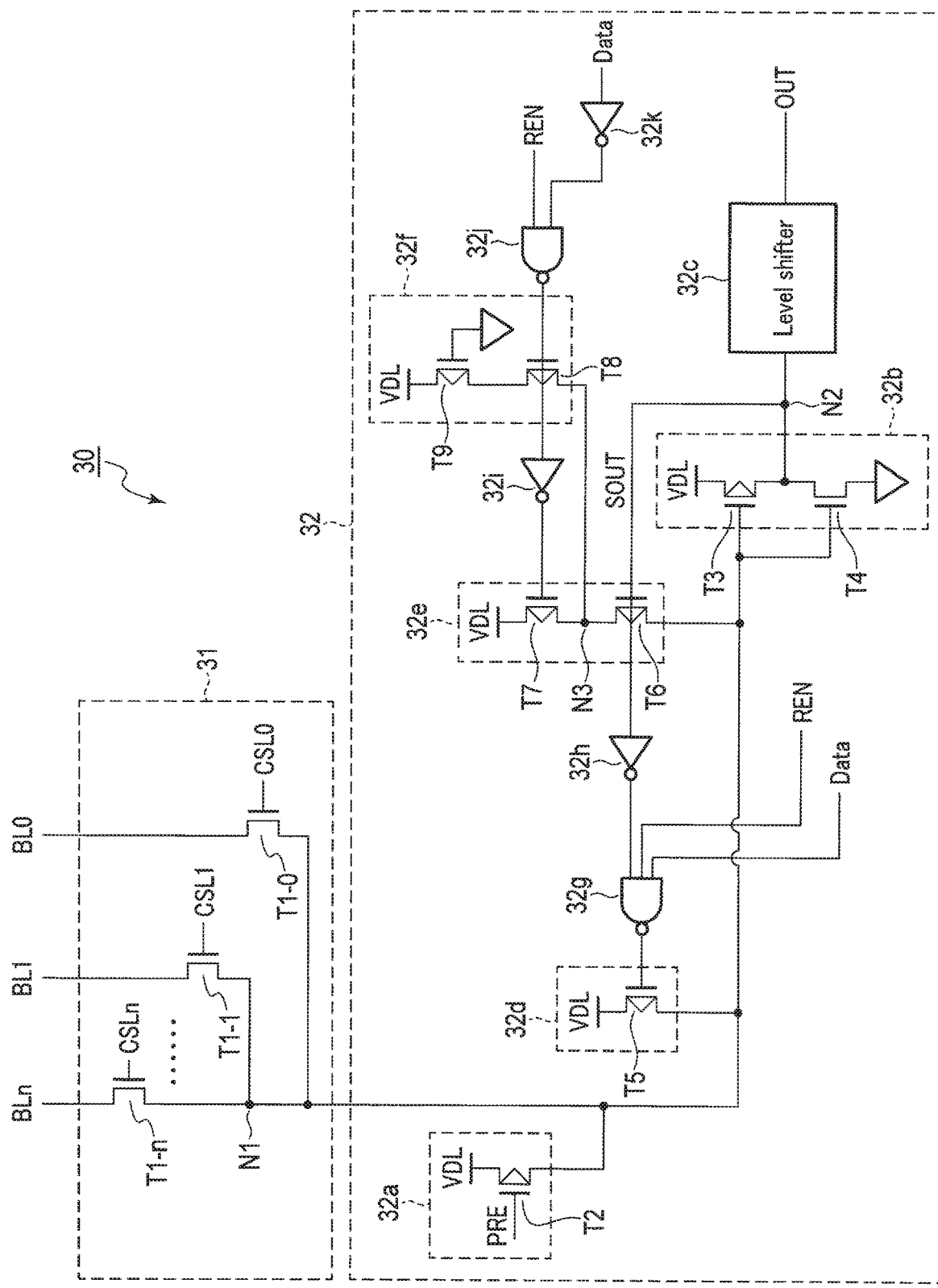
F I G. 3

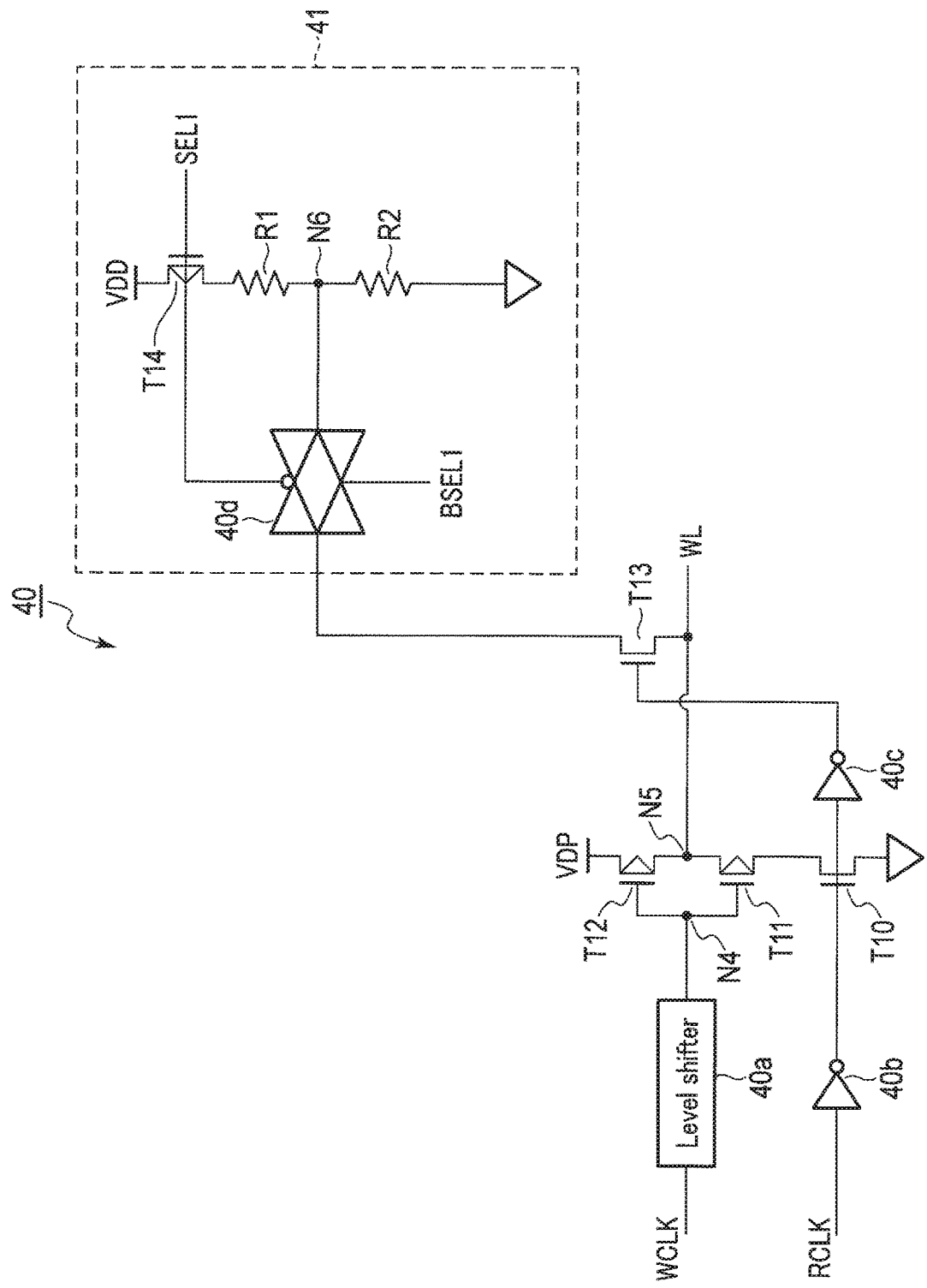
F I G. 4

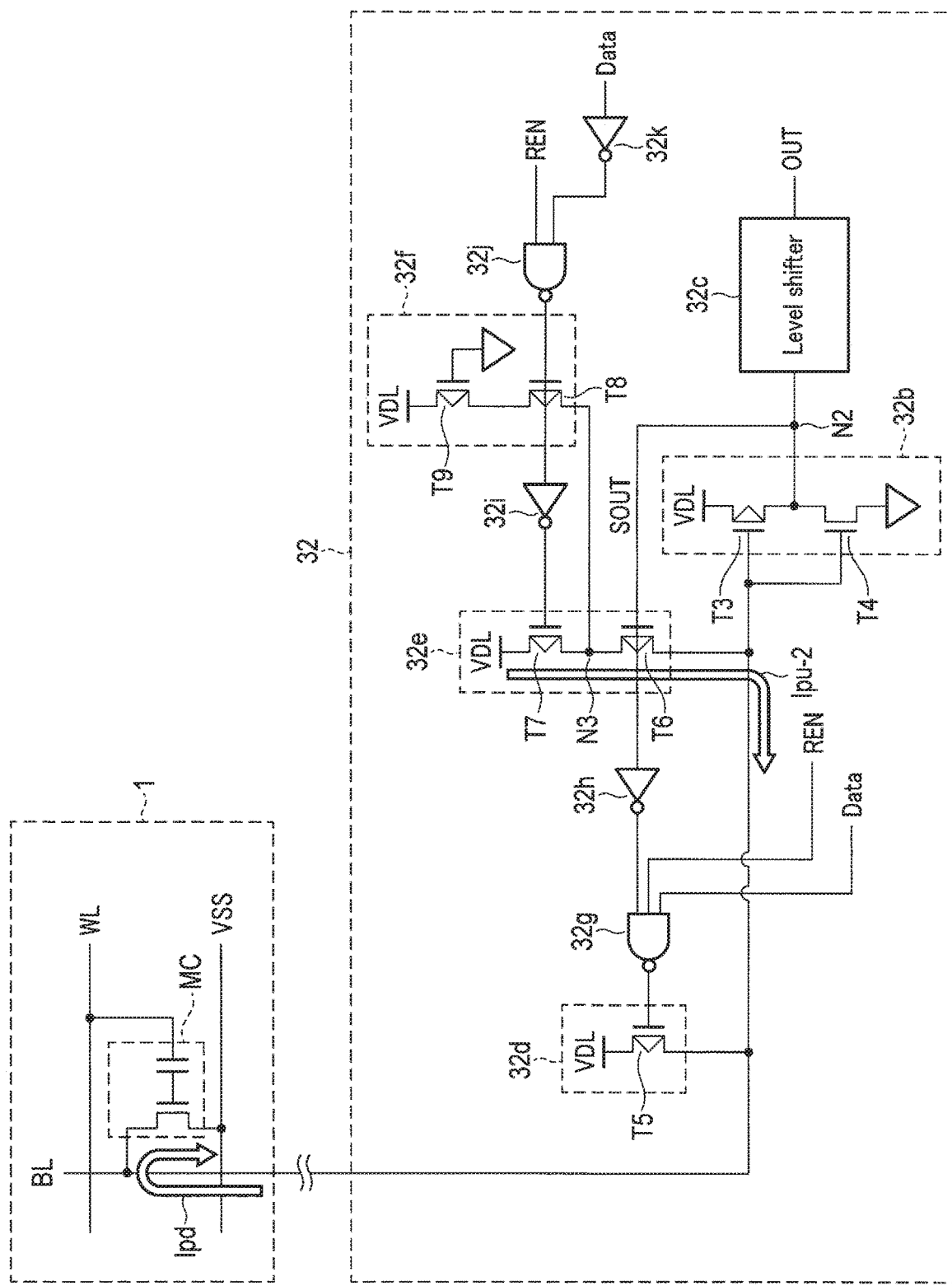
F I G. 9

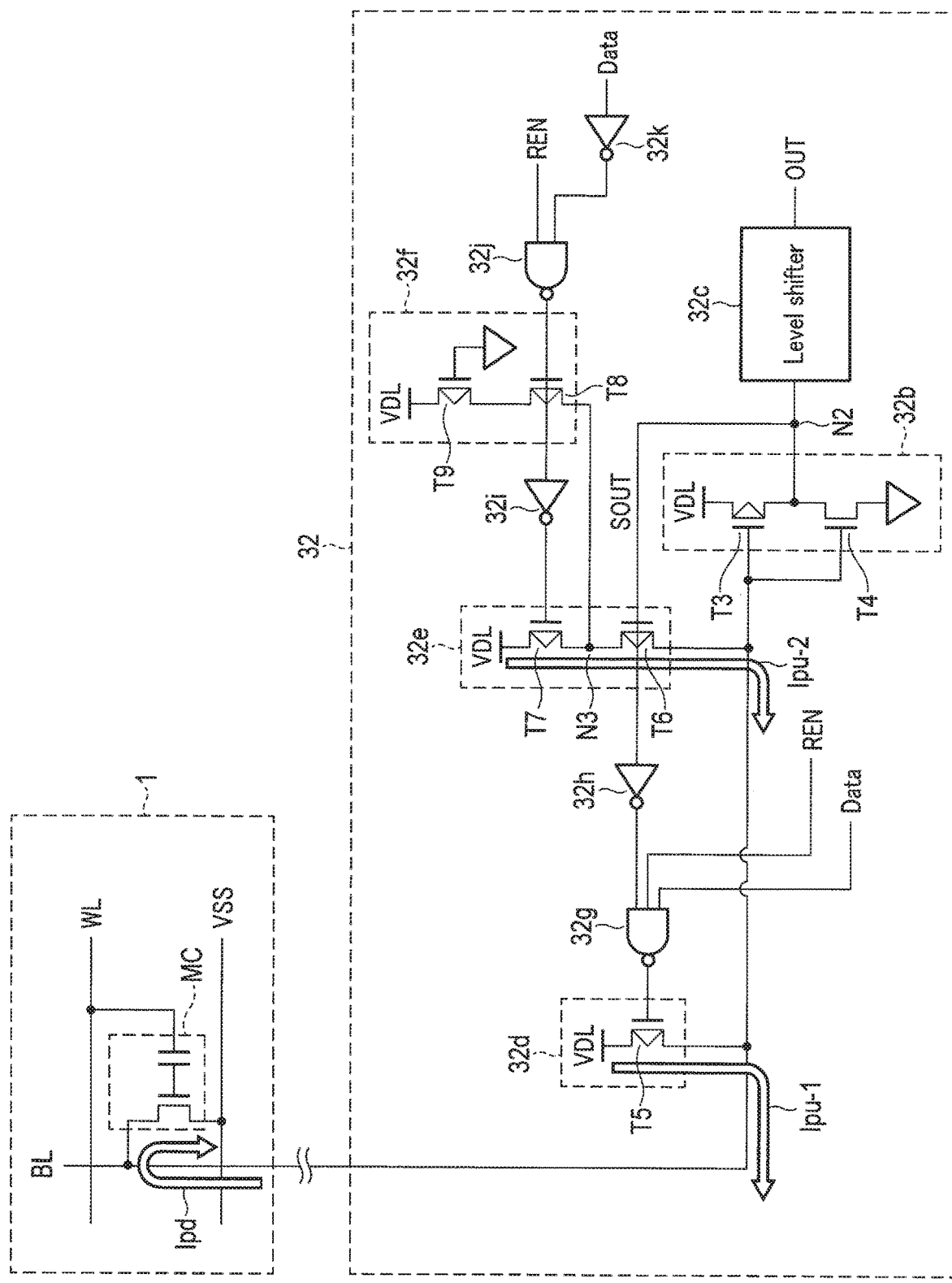
F I G. 10

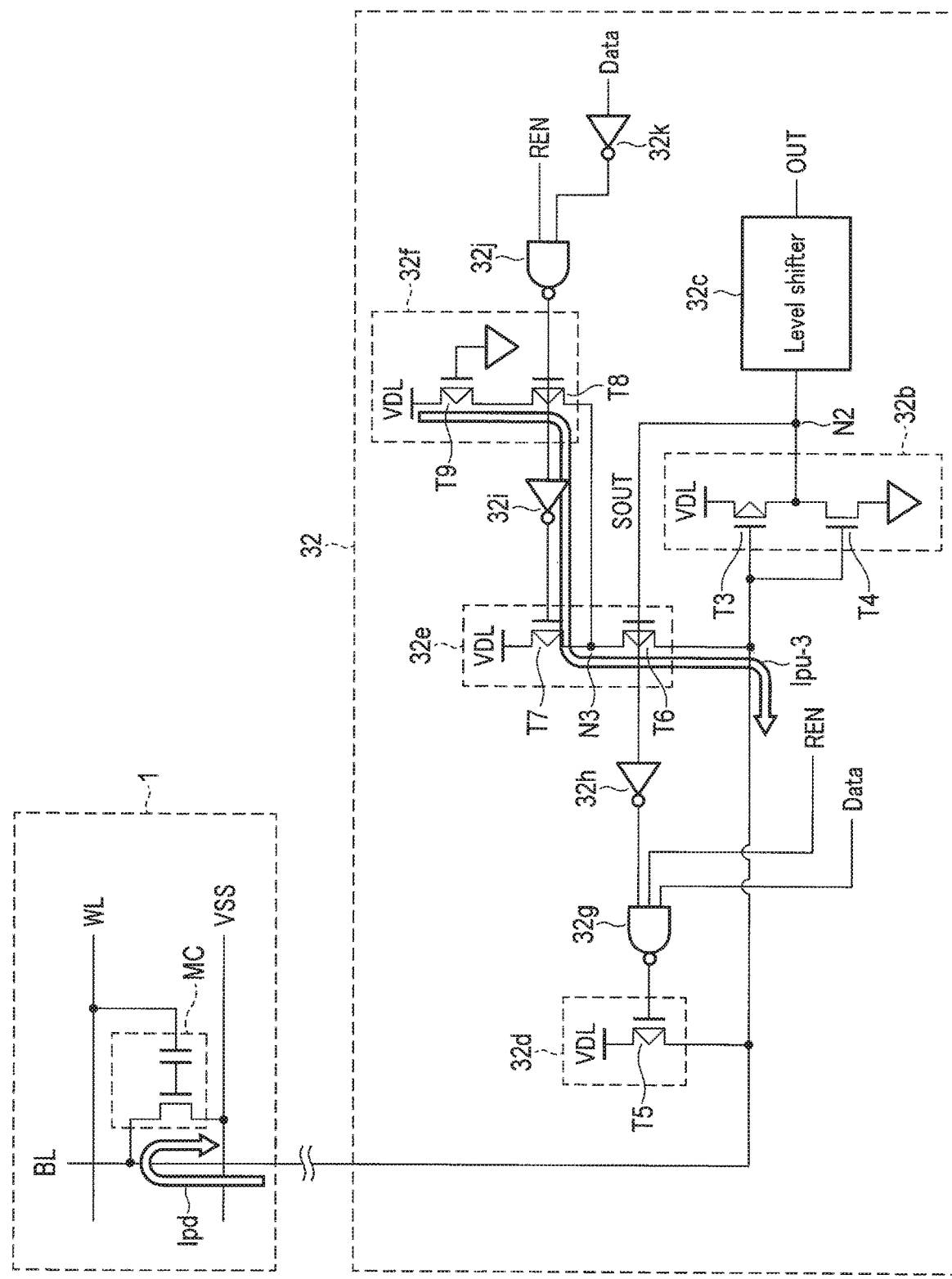
F I G. 11

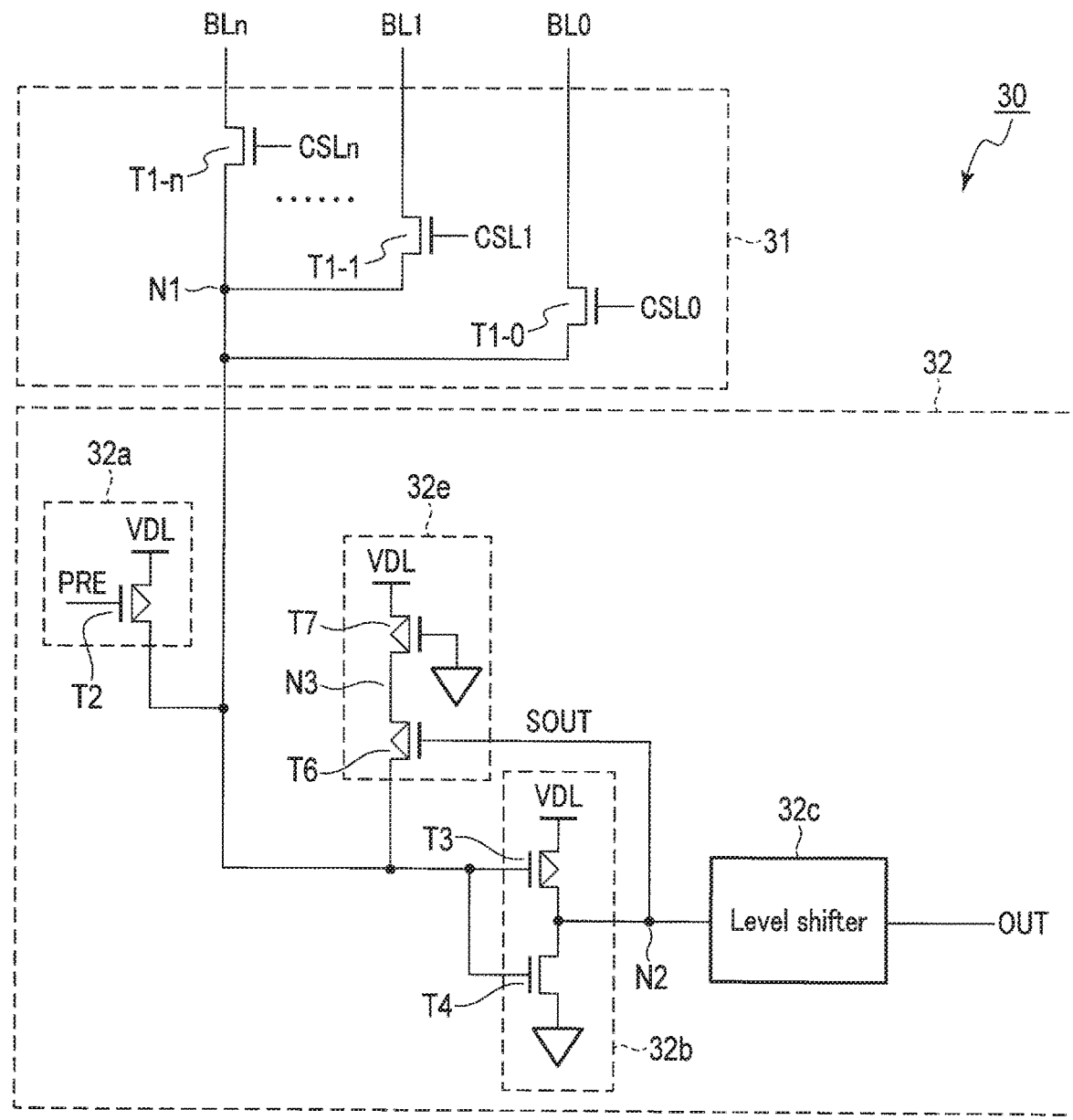
F I G. 12

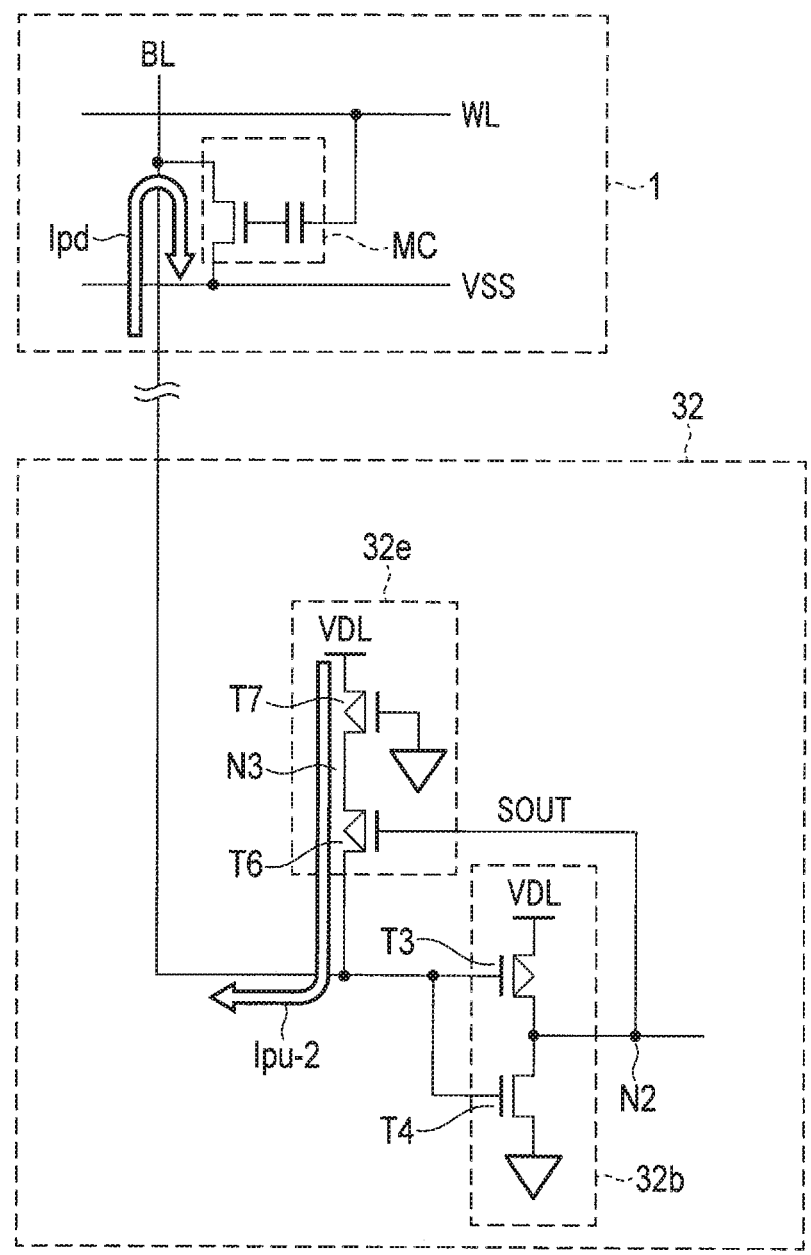
F I G. 13

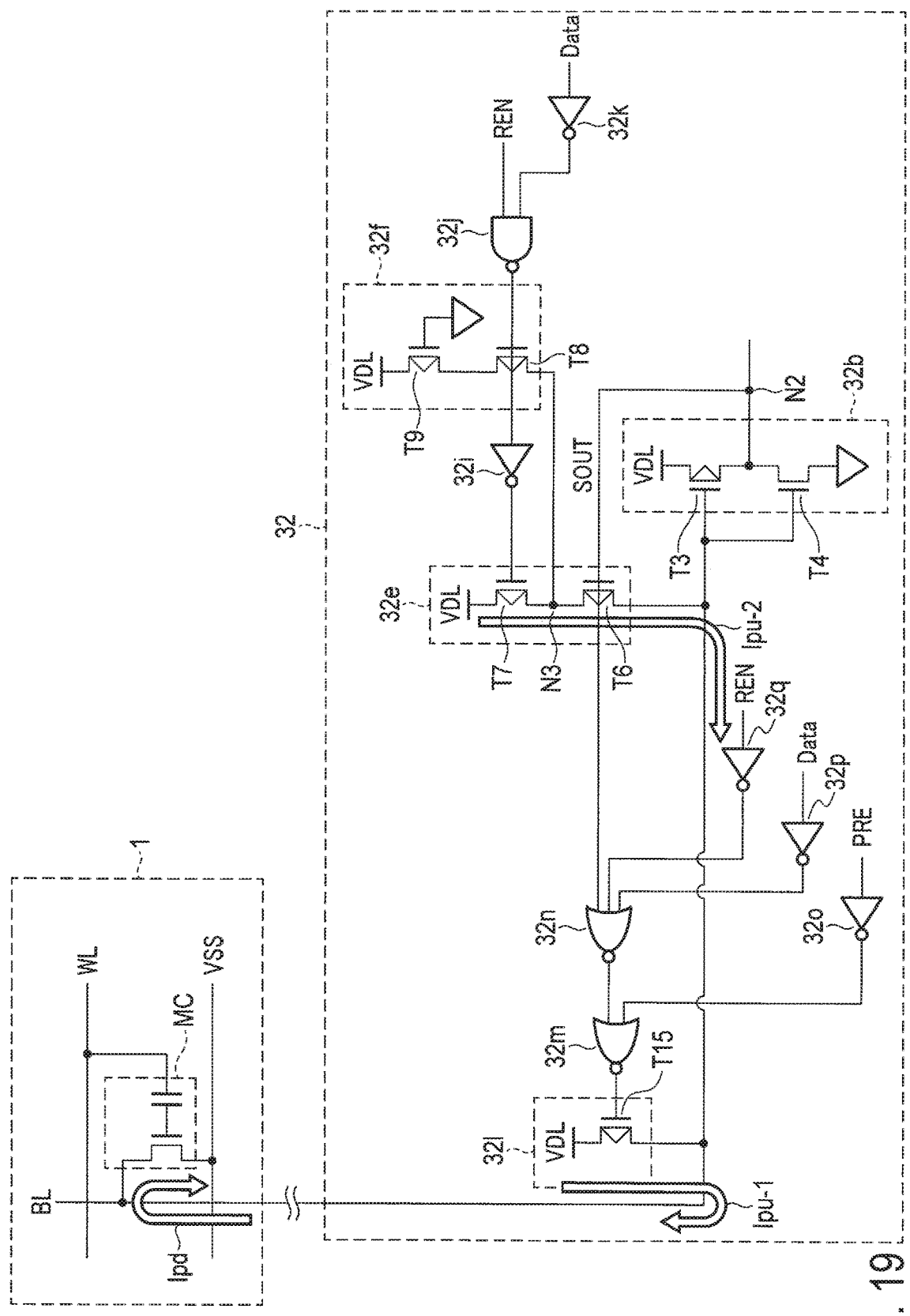
F I G. 19

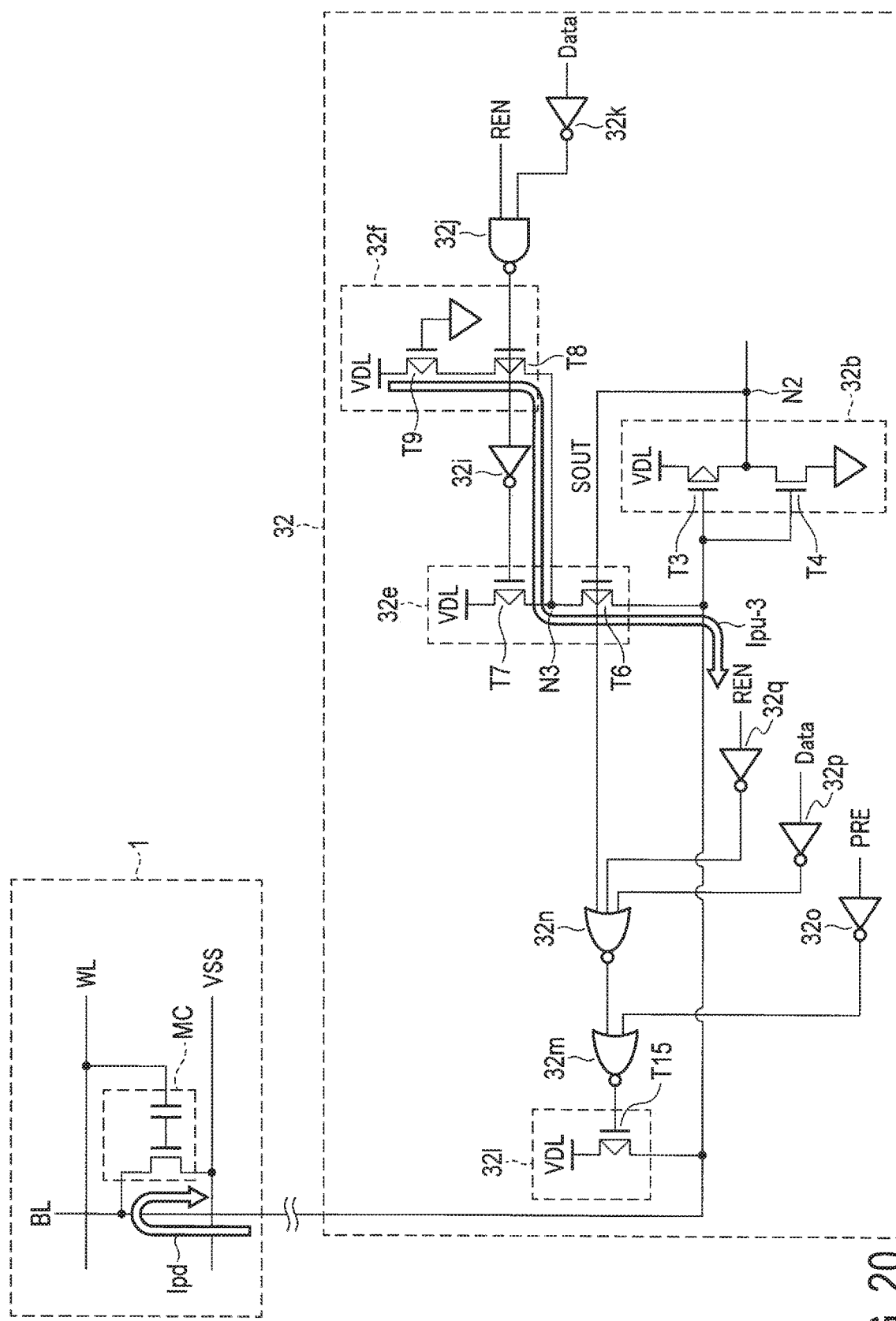
F I G. 20

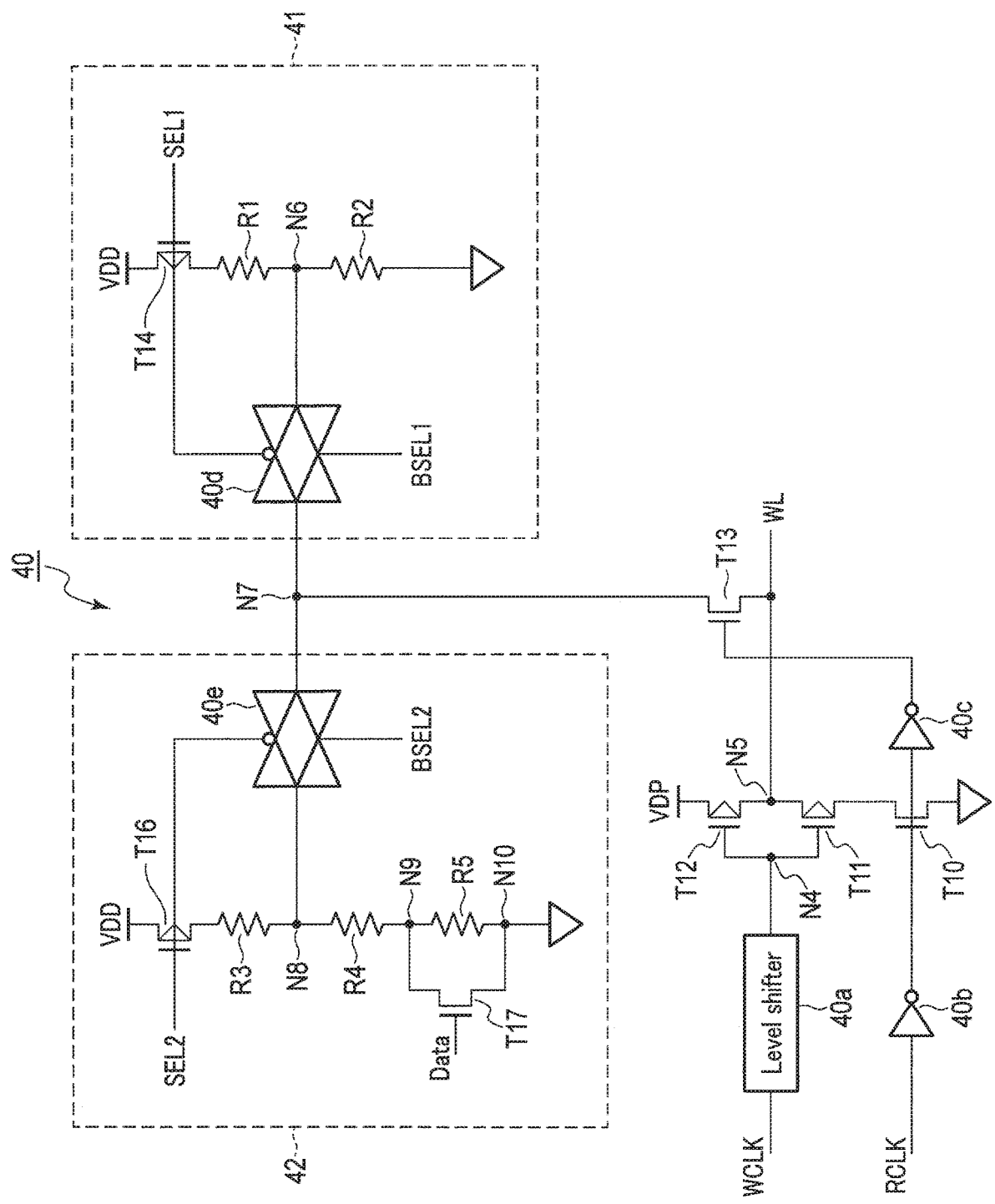
F I G. 21

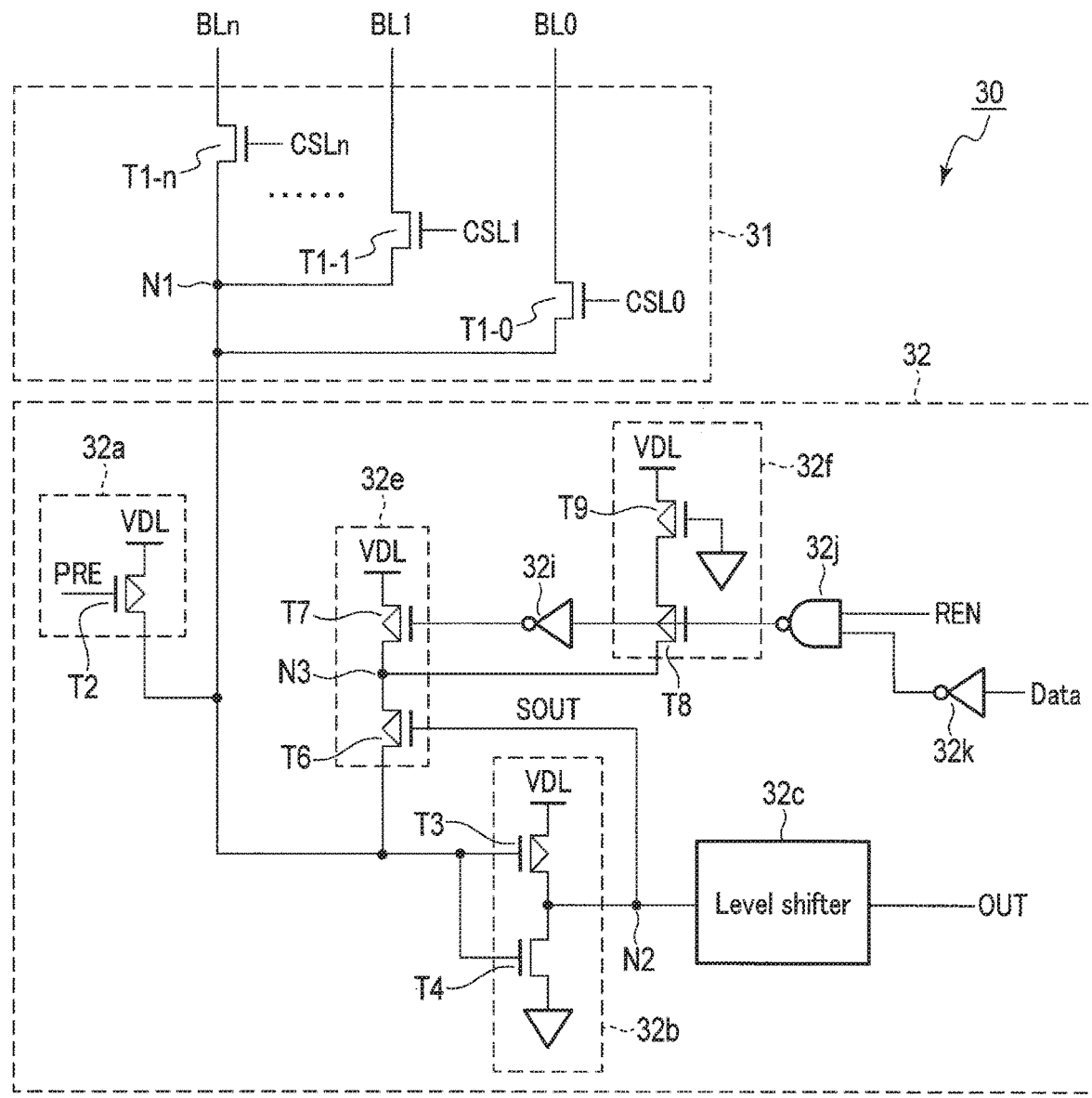
F I G. 22

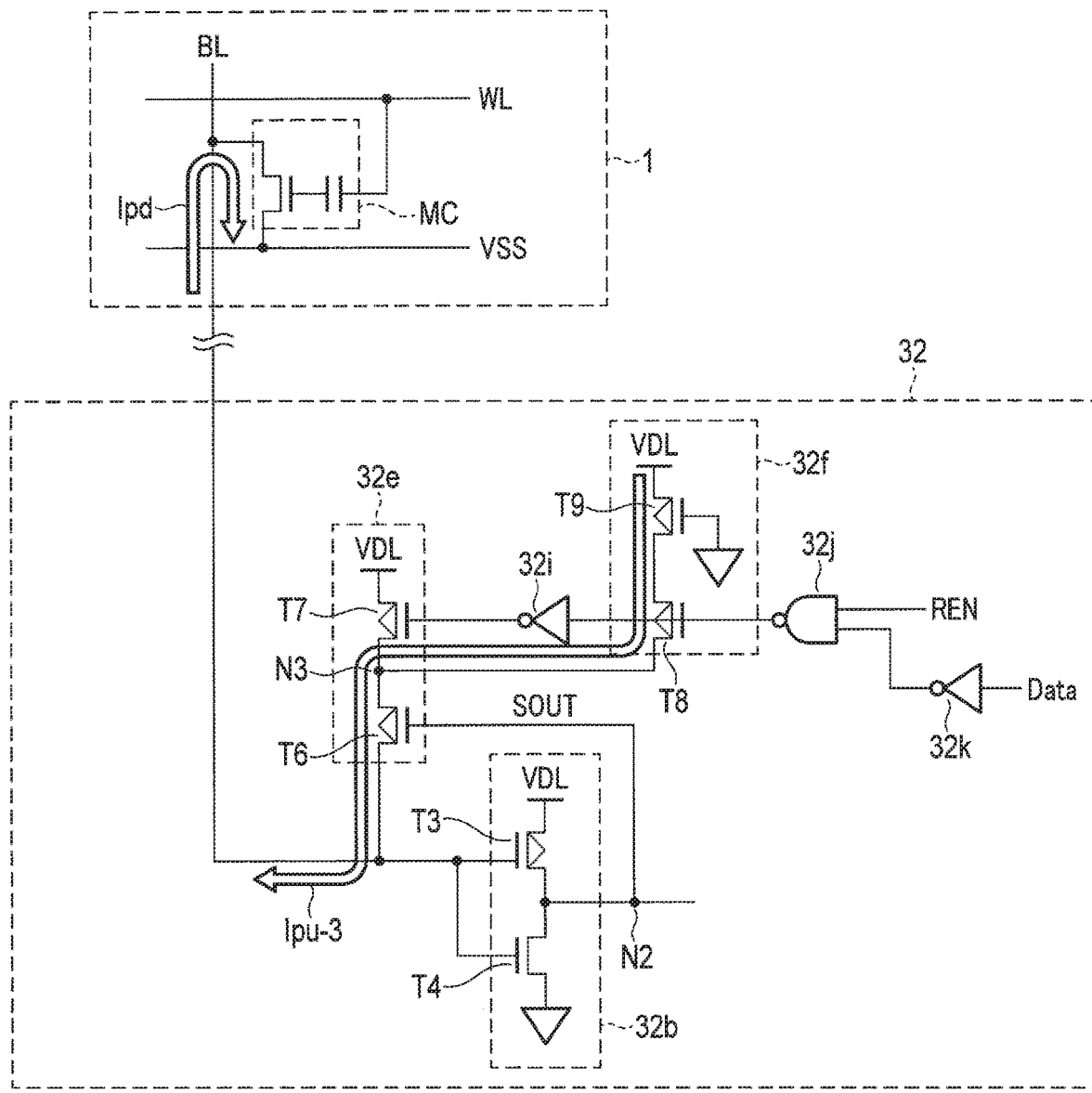
F I G. 24

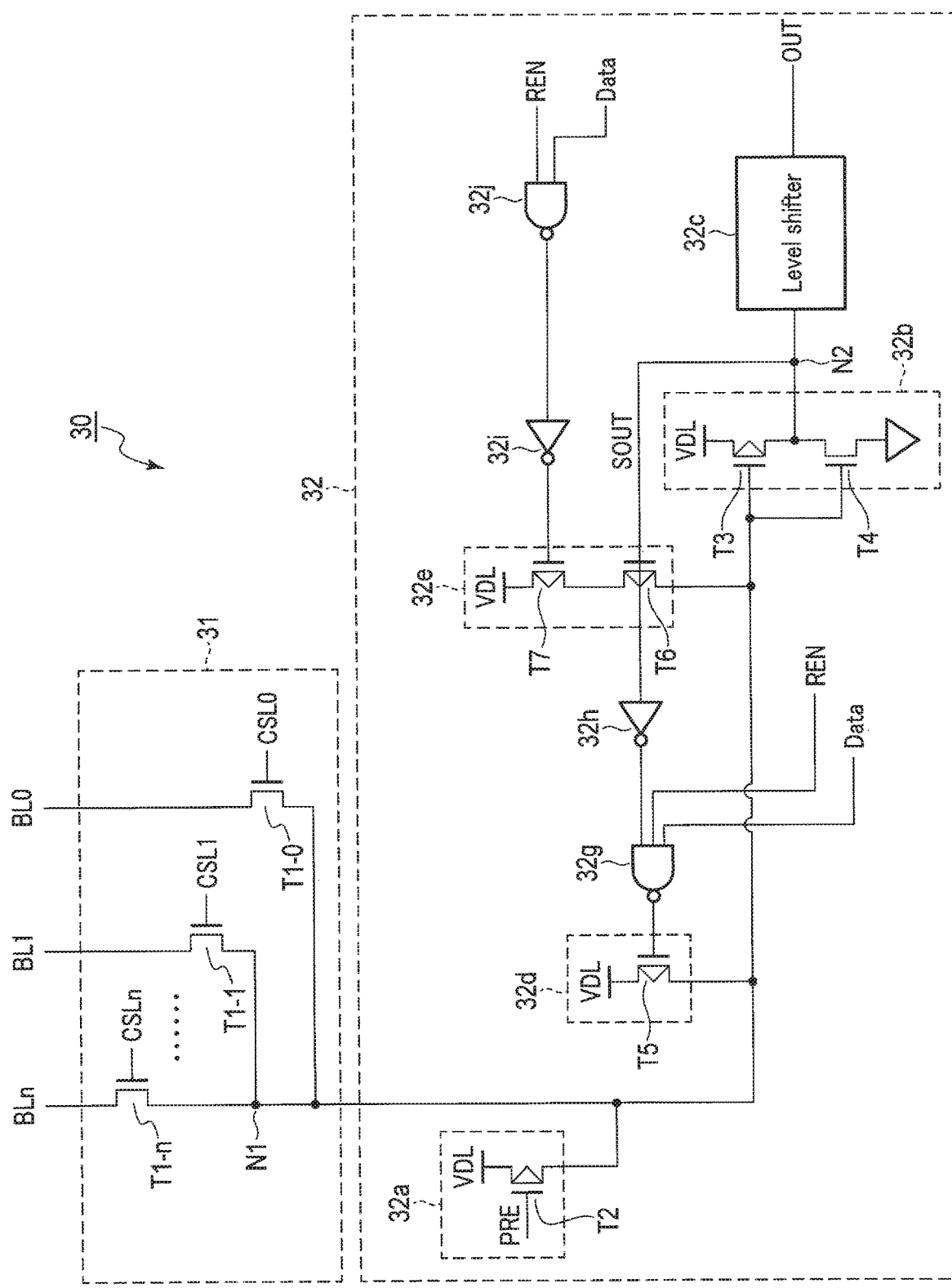
F I G. 25

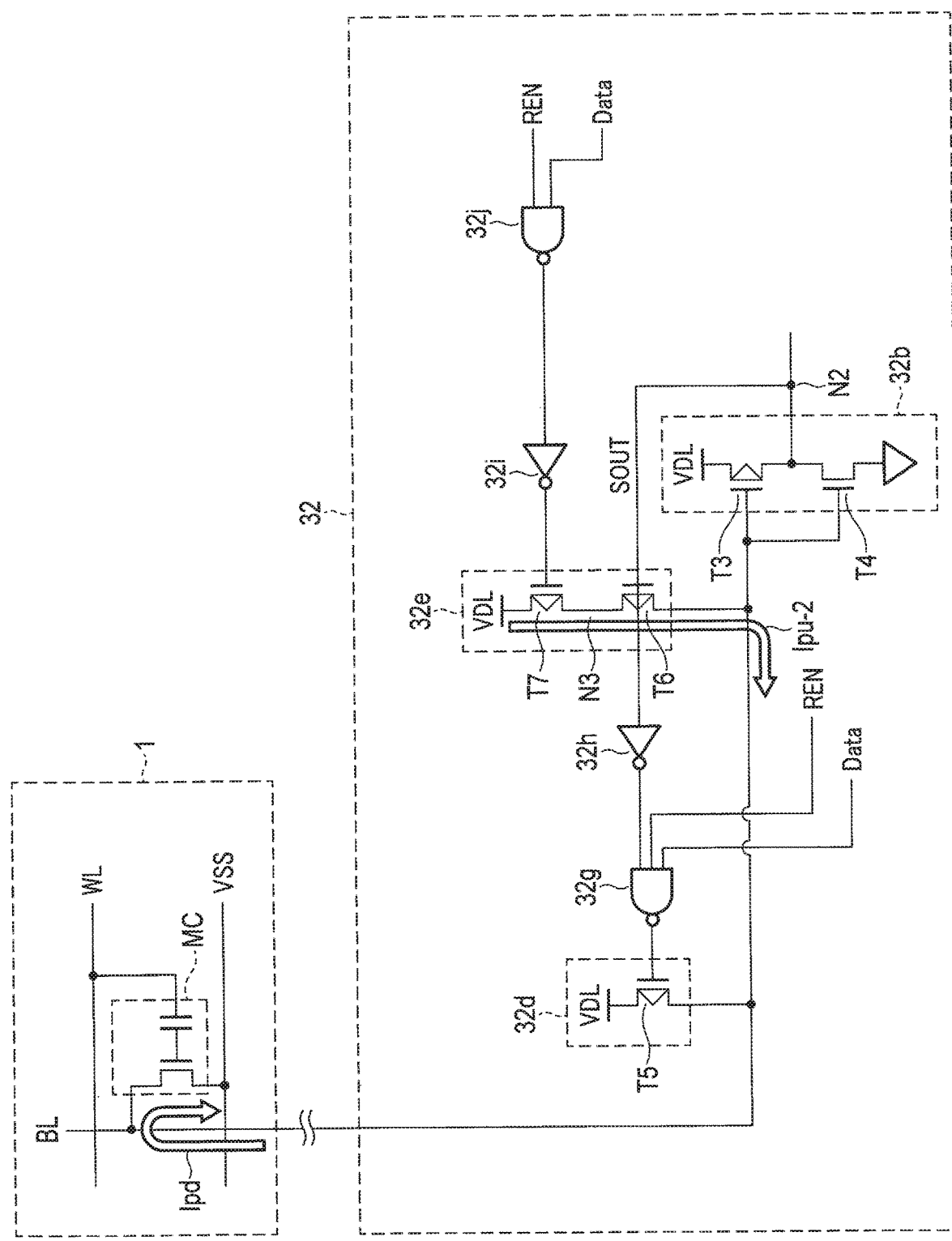
F I G. 26

SEMICONDUCTOR MEMORY DEVICE

CROSS-REFERENCE TO RELATED APPLICATIONS

This application is based upon and claims the benefit of priority from prior Japanese Patent Application No. 2017-188408, filed Sep. 28, 2017; the entire contents of which are incorporated herein by reference.

FIELD

Embodiments described herein relate generally to a semiconductor memory device.

BACKGROUND

In recent years, a data-rewritable multiple time programmable (MTP) memory has been developed.

BRIEF DESCRIPTION OF THE DRAWINGS

FIG. 3 is a circuit diagram showing a basic configuration of a read circuit of the semiconductor memory device according to the first embodiment.

FIG. 4 is a circuit diagram showing a basic configuration of a word line driver of the semiconductor memory device according to the first embodiment.

FIG. 9 is a circuit diagram showing current paths of a pull-up current and a pull-down current of a case where a threshold of a memory cell is determined in the semiconductor memory device according to the first embodiment.

FIG. 10 is a circuit diagram showing current paths of a pull-up current and a pull-down current of a case where a threshold of a memory cell is determined in the semiconductor memory device according to the first embodiment.

FIG. 11 is a circuit diagram showing current paths of a pull-up current and a pull-down current of a case where a threshold of a memory cell is determined in the semiconductor memory device according to the first embodiment.

FIG. 12 is a circuit diagram showing a basic configuration of the read circuit of the semiconductor memory device according to a comparative example of the first embodiment.

FIG. 13 is a circuit diagram showing current paths of a pull-up current and a pull-down current of a case where a threshold of a memory cell is determined in the semiconductor memory device according to the comparative example of the first embodiment.

FIG. 19 is a circuit diagram showing current paths of a pull-up current and a pull-down current of a case where a threshold of a memory cell is determined in the semiconductor memory device according to the second embodiment.

FIG. 20 is a circuit diagram showing current paths of a pull-up current and a pull-down current of a case where a threshold of a memory cell is determined in the semiconductor memory device according to the second embodiment.

FIG. 21 is a circuit diagram showing a basic configuration of the word line driver of the semiconductor memory device according to the third embodiment.

FIG. 22 is a circuit diagram showing a basic configuration of the read circuit of the semiconductor memory device according to the fourth embodiment.

FIG. 24 is a circuit diagram showing current paths of a pull-up current and a pull-down current of a case where a threshold of a memory cell is determined in the semiconductor memory device according to the fourth embodiment.

FIG. 25 is a circuit diagram showing a basic configuration of the read circuit of the semiconductor memory device according to the fifth embodiment.

FIG. 26 is a circuit diagram showing current paths of a pull-up current and a pull-down current of a case where a threshold of a memory cell is determined in the semiconductor memory device according to the fifth embodiment.

DETAILED DESCRIPTION

Figure 1:
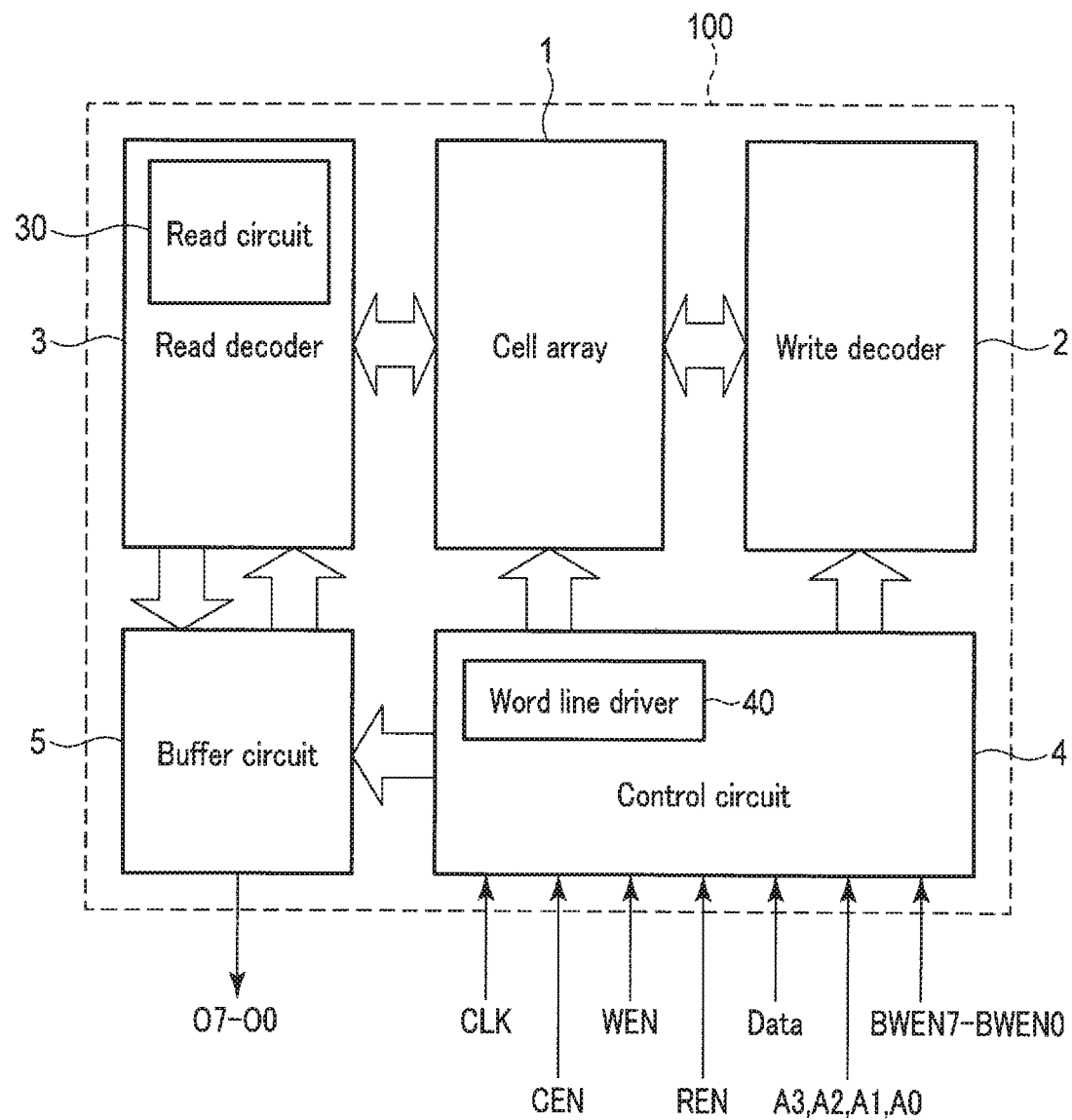
FIG. 1 is a block diagram schematically showing a semiconductor memory device according to the first embodiment.

In general, according to one embodiment, semiconductor memory device includes a first circuit that determines data stored in a memory cell; and a second circuit that controls the first circuit, wherein in a sequence in which the second circuit writes first data in the memory cell, the first circuit generates a first current of a first current value, and determines data stored in the memory cell based on the first current and a second current flowing in the memory cell, and in a sequence in which the second circuit writes second data different from the first data in the memory cell, the first circuit generates a third current of a second current value different from the first current value, and determines data stored in the memory cell based on the third current and the second current.

Hereinafter, embodiments will be described with reference to the drawings. In the following description, structural elements having substantially the same function and configuration will be assigned with the same reference numeral.

Note that the drawings are schematic and the relationship between thicknesses and planar dimensions, the ratio of thicknesses of layers, etc. are different from actual ones. The specific thicknesses and dimensions should be determined with reference to the following description. Needless to say, some ratios and relationships between dimensions are different among drawings.

<1> First Embodiment

<1-1> Configuration
<1-1-1> Semiconductor Memory Device

A general description of a semiconductor memory device 100 according to the first embodiment will be given with reference to FIG. 1. FIG. 1 is a block diagram schematically showing the semiconductor memory device according to the first embodiment.

As shown in FIG. 1, the semiconductor memory device 100 comprises a cell array 1, a write decoder 2, a read decoder 3, a control circuit 4, and a buffer circuit 5.

The cell array 1 comprises a plurality of memory cells MC two-dimensionally arranged in a matrix. The memory cell MC is, for example, an MTP memory. Each memory cell MC is arranged in correspondence with a point of intersection of a bit line BL and a word line WL. The bit lines BL extend in a column direction. The word lines WL extend in a row direction, which is orthogonal to the column direction.

The write decoder 2 is connected to the memory cells MC via the bit lines BL, and is configured to write data in the memory cell MC.

The read decoder 3 comprises a read circuit 30. The read circuit 30 is connected to the memory cells MC via the bit lines BL, and is configured to read data from the memory cell MC.

The control circuit 4 controls the semiconductor memory device 100 based on a signal from a memory controller, which is not shown. Specifically, the control circuit 4 receives a clock signal CLK, a chip enable signal CEN, a write enable signal WEN, a read enable signal REN, a column address A<3:0>, a bit write enable signal BWEN <7:0>, and write data (Data). The control circuit 4 comprises a word line driver 40. The word line driver 40 is connected to the memory cells MC via the word lines WL, and supplies a given voltage.

The buffer circuit 5 temporarily stores various data. The buffer circuit 5 also outputs, as output data 0<7:0>, data read from the cell array 1.

<1-1-2> Cell Array

Figure 2:
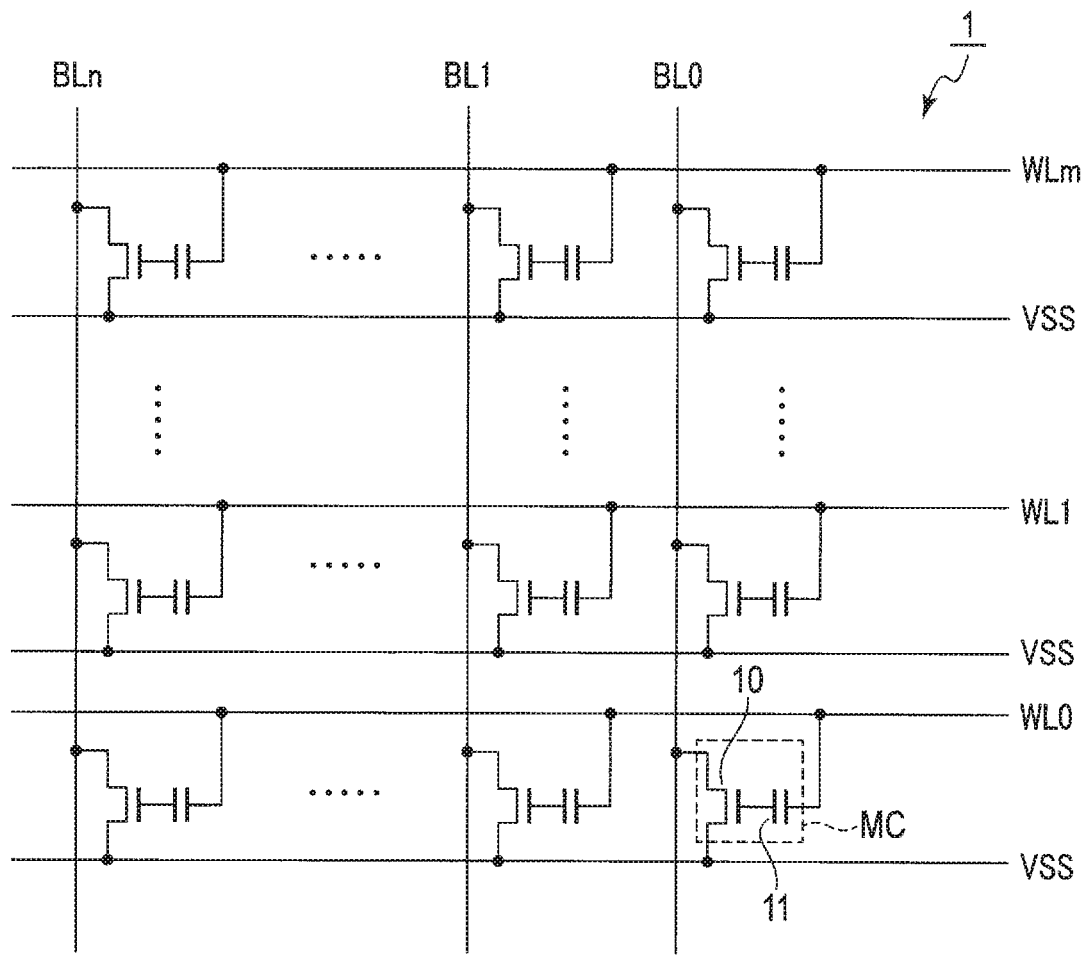
FIG. 2 is a circuit diagram showing a basic configuration of a cell array of the semiconductor memory device according to the first embodiment.

Next, a basic configuration of the cell array 1 according to the present embodiment will be described with reference to FIG. 2. FIG. 2 is a circuit diagram showing a basic configuration of the cell array of the semiconductor memory device according to the first embodiment.

As shown in FIG. 2, for example, the cell array 1 includes a plurality of memory cells MC. The memory cells MC are arranged in an array in the cell array 1. A plurality of bit lines BL and a plurality of word lines WL are provided in the cell array 1. The bit lines BL extend in the column direction, and the word lines WL extend in the row direction.

Each memory cell MC comprises an NMOS transistor 10 and a capacitor 11. One end of the NMOS transistor 10 is connected to a bit line, the other end is supplied with a ground voltage VSS (for example, 0V), and the gate is connected to a first electrode of the capacitor 11. The first electrode of the capacitor 11 is connected to a gate electrode of the NMOS transistor 10, and a second electrode of the capacitor 11 is connected to a word line WL.

<1-1-3> Read Circuit

Next, a circuit configuration of the read circuit 30 will be described with reference to FIG. 3.

As shown in FIG. 3, the read circuit 30 comprises a column selection circuit 31 and a sense circuit 32. FIG. 3 is a circuit diagram showing a basic configuration of the read circuit of the semiconductor memory device according to the first embodiment.

The column selection circuit 31 comprises selection transistors T1-0 to T1-*n* corresponding to bit lines BL0 to BLn. One end of each of the selection transistors T1-0 to T1-*n* is connected to the bit line BL0 to BLn, the other end is connected to node N1, and the gate is supplied with a signal CSL0 to CSLn. The selection transistors T1-0 to T1-*n* electrically connect the bit lines BL0 to BLn to node N1 based on the signals CSL0 to CSLn.

The sense circuit 32 comprises a bit line precharge circuit 32*a*, a sense amplifier 32*b*, a level shifter 32*c*, keeper circuit 32*d*, keeper circuit 32*e*, keeper circuit 32*f*, NAND operation circuit 32*g*, inverter circuit 32*h*, inverter circuit 32*i*, NAND operation circuit 32*j*, and inverter circuit 32*k*.

The bit line precharge circuit 32*a* comprises a PMOS transistor T2. One end of the transistor T2 is supplied with voltage VDL (for example, 2V), the other end is connected to node N1, and the gate is supplied with signal PRE. For example, when a bit line is precharged, the control circuit 4 brings control signal PRE to an L level. The bit line precharge circuit 32*a* thereby transfers voltage VDL to node N2.

The sense amplifier 32*b* comprises a PMOS transistor T3 and an NMOS transistor T4. One end of transistor T3 is supplied with voltage VDL, the other end is connected to node N2, and the gate is connected to node N1. One end of transistor T4 is connected to node N2, the other end is supplied with the ground voltage VSS, and the gate is connected to node N1. The sense amplifier 32*b* senses the electrical potential of a bit line BL via node N1, and generates signal SOUT.

The level shifter 32*c* generates output signal OUT based on signal SOUT received via the sense amplifier 32*b*. The read decoder 3 generates signal 0<7:0> based on output signal OUT.

Inverter circuit 32*h* receives signal SOUT, inverts it, and outputs the inverted signal.

NAND operation circuit 32*g* performs a NAND operation based on the output signal from inverter circuit 32*h*, signal REN, and write data (Data).

Inverter circuit 32*k* receives write data (Data), inverts it, and outputs the inverted data.

NAND operation circuit 32*j* performs a NAND operation based on the output signal from inverter circuit 32*k* and signal REN.

Inverter circuit 32*i* receives the operation result of NAND operation circuit 32*j*, inverts it, and outputs the inverted data.

Keeper circuit 32*d* comprises a PMOS transistor T5. One end of transistor T5 is supplied with voltage VDL, the other end is connected to node N1, and the gate is supplied with an operation result of NAND operation circuit 32g. Keeper circuit 32d is turned on (brought into conduction) only when signal SOUT is at the L level, signal REN is at an H (L<H) level, and write data (Data) is at the H level.

Keeper circuit 32e comprises PMOS transistors T6 and T7. One end of transistor T6 is connected to node N3, the other end is connected to node N1, and the gate is connected to node N2. One end of transistor T7 is supplied with voltage VDL, the other end is connected to node N3, and the gate is supplied with an operation result of inverter circuit 32i. Transistor T6 is turned on when signal SOUT is at the L level. Transistor T7 is turned on except when signal REN is at the H level, and write data (Data) is at the L level.

Keeper circuit 32f comprises PMOS transistors T8 and T9. One end of transistor T9 is supplied with voltage VDL, the other end is connected to one end of transistor T8, and the gate is supplied with the ground voltage VSS. The other end of transistor T8 is connected to node N3, and the gate is supplied with an operation result of NAND operation circuit 32j. Transistor T8 is turned on when signal REN is at the H level, and write data (Data) is at the L level. Transistor T9 is always ON.

<1-1-4> Word Line Driver

Next, a circuit configuration of the word line driver 40 will be described with reference to FIG. 4. FIG. 4 is a circuit diagram showing a basic configuration of the word line driver of the semiconductor memory device according to the first embodiment.

As shown in FIG. 4, the word line driver 40 comprises a level shifter 40a, inverter circuits 40b and 40c, NMOS transistors T11, T10, and T13, a PMOS transistor T12, and a voltage generation circuit 41.

The level shifter 40a receives and level-shifts, for example, a write clock WCLK generated by the control circuit 4. The level shifter 40a supplies the level-shifted signal to node N4.

One end of transistor T12 is supplied with voltage VDP (a high voltage higher than 7V), the other end is connected to node N5, and the gate is connected to node N4. One end of transistor T11 is connected to node N5, the other end is connected to one end of transistor T10, and the gate is connected to node N4. Node N5 is connected to a word line WL.

Inverter circuit 40b receives a read clock RCLK, inverts it, and outputs the inverted signal.

Inverter circuit 40c receives the output signal of inverter circuit 40b, inverts it, and outputs the inverted signal.

The other end of transistor T10 is supplied with the ground voltage VSS, and the gate is supplied with the output signal of inverter circuit 40b.

One end of transistor T13 is connected to the voltage generation circuit 41, the other end is connected to node N5, and the gate is supplied with the output signal of inverter circuit 40c.

The voltage generation circuit 41 comprises a transfer gate 40d, a PMOS transistor T14, and resistance elements R1 and R2.

One end of the transistor T14 is supplied with voltage VDD (for example, 5V), the other end is connected to one end of resistance element R1, and the gate is supplied with signal SEL1. Signals SEL1 and BSEL1 are generated by, for example, the control circuit 4.

The other end of resistance element R1 is connected to node N6.

One end of resistance element R2 is connected to node N6, and the other end is supplied with the ground voltage VSS.

The transfer gate 40d transfers the voltage of node N6 to one end of transistor T13 in accordance with signal SEL1 and signal BSEL1 (inverted signal of signal SEL1).

In a write operation, the word line driver 40 transfers voltage VDP to a word line WL based on clock WCLK.

In a read operation or a verification operation, the word line driver 40 transfers the voltage (for example, 2V) of node N6 to a word line WL based on clock RCLK and signal SEL1.

Specifically, in an ordinary read operation or a verification operation, the control circuit 4 brings signal BSEL1 to the H level, and signal SEL1 to the L level. Consequently, the transfer gate 40d and the PMOS transistor T14 of the voltage generation circuit 41 are turned on. As a result, the word line driver 40 supplies a voltage (2V) from the voltage generation circuit 41 to the word line WL.

<1-1-5> Threshold Distribution of Memory Cells

Figure 5:
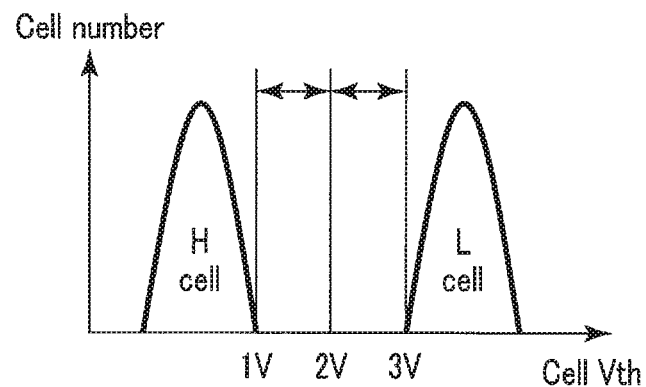
FIG. 5 shows a threshold distribution of memory cells of the semiconductor memory device according to the first embodiment.

Next, a threshold distribution of memory cells MC will be described with reference to FIG. 5. FIG. 5 shows a threshold distribution of memory cells of the semiconductor memory device according to the first embodiment.

The memory cell MC can store binary data, that is, H data and L data, by controlling charges residing between the gate of the transistor 10 and the first electrode of the capacitor 11.

In the first embodiment, as shown in FIG. 5, the threshold distribution of memory cells MC storing H data is 1V or lower. The threshold distribution of memory cells MC storing L data is 3V or higher.

Accordingly, in the present embodiment, an approximately 2V margin is provided between the threshold distribution of memory cells MC storing H data and the threshold distribution of memory cells MC storing L data. A write operation for generating the threshold distribution will be described below.

<1-2> Operation

Figure 6:
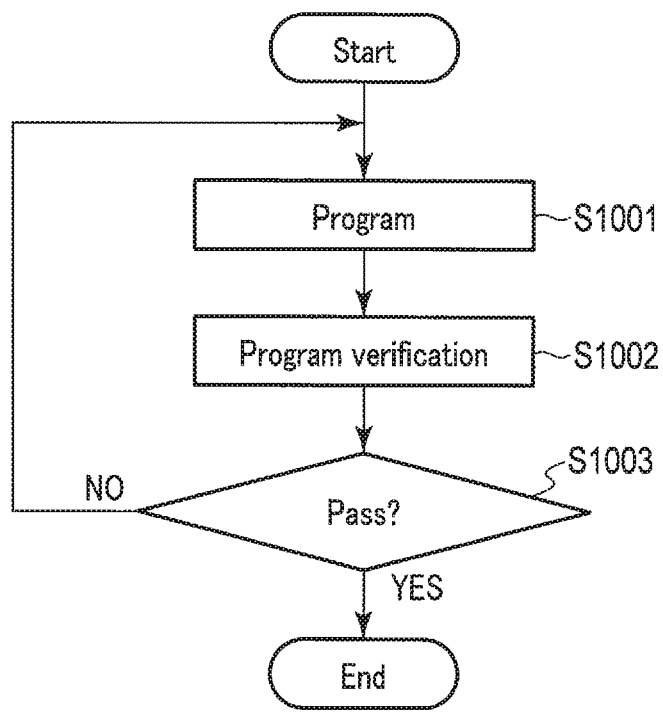
FIG. 6 is a flowchart showing a write operation of the semiconductor memory device according to the first embodiment.

The write operation of the semiconductor memory device according to the present embodiment will be described with reference to FIG. 6. FIG. 6 is a flowchart showing the write operation of the semiconductor memory device according to the present embodiment. The write operation (sequence) includes a program operation which varies the threshold of the memory cell MC, and a program verification operation which determines whether write data has been written by the program operation (determines the success or failure of the program operation).

[Step S1001]

Upon receipt of a write instruction, the control circuit 4 performs the program operation on the cell array 1.

For example, when L data is written in a target memory cell MC, charges are injected between the gate of the transistor 10 and the first electrode of the capacitor 11. When H data is written in the target memory cell MC, charges are extracted from between the gate of the transistor 10 and the first electrode of the capacitor 11. Hereinafter, the write target memory cell MC is also referred to as a selected memory cell MC, etc.

[Step S1002]

After the program operation, the control circuit 4 performs the program verification operation which determines whether or not a write to the selected memory cell MC has been completed.

Figure 7:
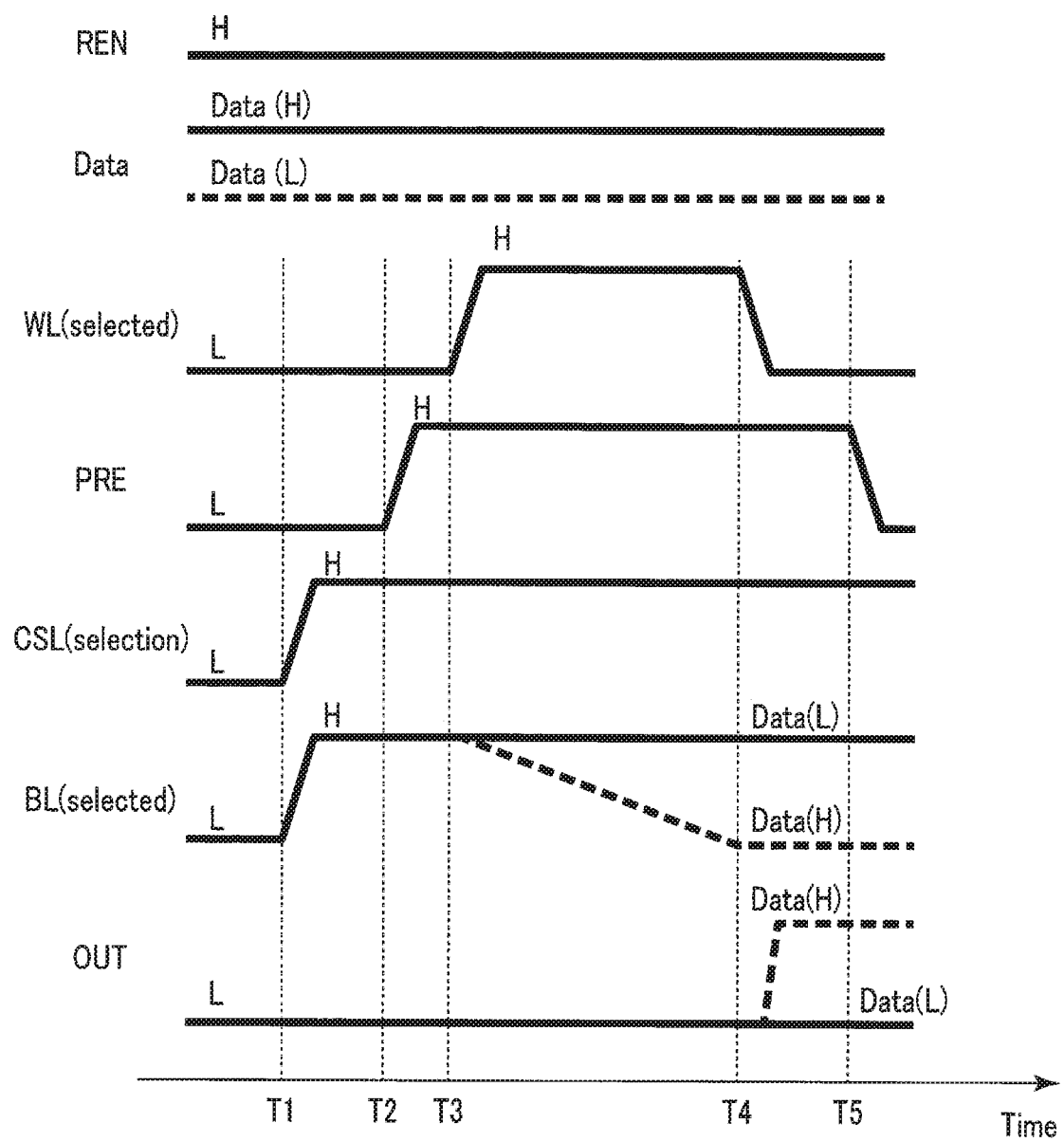
FIG. 7 is a waveform chart showing a program verification operation of the semiconductor memory device according to the first embodiment.

Here, the waveforms in the program verification operation will be described with reference to FIG. 7. FIG. 7 is a waveform chart showing the program verification operation of the semiconductor memory device according to the first embodiment.

[Time T1 to Time T2]

The control circuit 4 receives an H-level signal and write data (Data) from a memory controller.

Prior to the program verification operation, the control circuit 4 brings signal PRE to the L level. Node N1 is thereby charged to the H level by the bit line precharge circuit 32a.

The control circuit 4 raises the column selection signal CSL from the L level to the H level. A selected bit line is thereby electrically connected to node N1. As a result, the electrical potential of the selected bit line BL is brought to the H level.

[Time T2 to Time T3]

Upon completion of the charge of the selected bit line BL, the control circuit 4 raises signal PRE to the H level. This is the end of the charge of the selected bit line BL.

[Time T3 to Time T4]

The word line driver 40 transfers the voltage of node N6 to a selected word line WL. The electrical potential of the selected word line WL is thereby brought to the H level. A data determination of the selected memory cell MC is thereby performed.

Here, a method for the data determination of the selected memory cell MC will be described with reference to FIGS. 8-11. FIGS. 8-11 are circuit diagrams showing current paths of a pull-up current and a pull-down current of a case where a threshold of a memory cell is determined in the semiconductor memory device according to the first embodiment. In FIGS. 8-11, structures not related to the pull-up current or the pull-down current are omitted.

Figure 8:
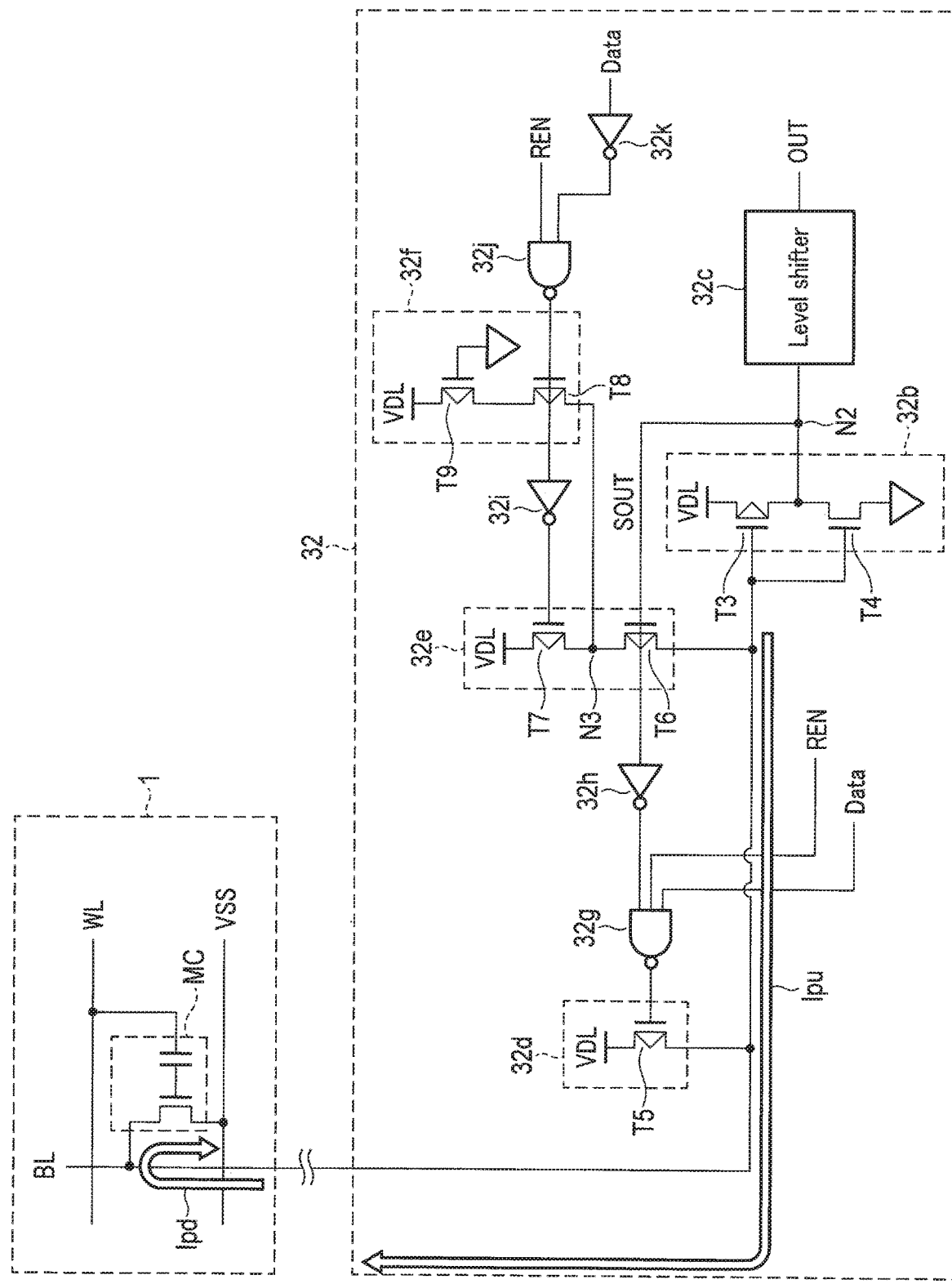
FIG. 8 is a circuit diagram showing current paths of a pull-up current and a pull-down current of a case where a threshold of a memory cell is determined in the semiconductor memory device according to the first embodiment.

As shown in FIG. 8, a current flowing in the selected memory cell MC is called a pull-down current Ipd. The pull-down current Ipd depends on the threshold Vth of the selected memory cell MC. A current flowing in the selected bit line BL from time T3 to time T4 is called a pull-up current Ipu. The pull-up current Ipu depends on the voltage transfer capabilities of the keeper circuits.

When the pull-up current Ipu is smaller than the pull-down current Ipd (Ipu<Ipd), output signal OUT is determined as the H level. Specifically, when the pull-up current Ipu is smaller than the pull-down current Ipd, the sense amplifier 32b outputs H-level signal SOUT. Then, the level shifter 32c outputs H-level output signal OUT.

When the pull-up current Ipu is larger than the pull-down current Ipd (Ipu>Ipd), output signal OUT is determined as the L level. Specifically, when the pull-up current Ipu is larger than the pull-down current Ipd, the sense amplifier 32b outputs L-level signal SOUT. Then, the level shifter 32c outputs L-level output signal OUT.

Here, the pull-up current Ipu in the ordinary read operation, not the program verification operation, will be described with reference to FIG. 9. In the ordinary read operation, signal REN and write data (Data) are brought to the H level, and signal SOUT is brought to the L level. Inverter circuit 32k thereby generates an L-level signal based on the H-level write data (Data). NAND operation circuit 32j generates an H-level signal based on H-level signal REN and the L-level signal. Inverter circuit 32i generates an L-level signal based on the output signal of NAND operation circuit 32j. Transistor T7 is thereby turned on. Transistor T6 is also turned on based on the L-level signal. As a result, a pull-up current Ipu (Ipu-2) is supplied from keeper circuit 32e to the selected bit line BL.

Next, the pull-up current Ipu in the program verification operation (time T3 to time T4) for an H-data write will be described with reference to FIG. 10.

When H data is written, signal REN and write data (Data) are brought to the H level, and signal SOUT is brought to the L level, from time T3 to time T4. Inverter circuit 32h generates an H-level signal based on L-level signal SOUT. NAND operation circuit 32g outputs an L-level signal based on the H-level signal REN, write data (Data), and output of inverter circuit 32h. Transistor T5 is turned on based on the result (L-level signal) of NAND operation circuit 32g. Consequently, a pull-up current Ipu (Ipu-1) is supplied from keeper circuit 32d to the selected bit line BL.

In addition, inverter circuit 32k generates an L-level signal based on the H-level write data (Data). NAND operation circuit 32j generates an H-level signal based on H-level signal REN and the L-level signal. Inverter circuit 32i generates an L-level signal based on the H-level output signal of NAND operation circuit 32j. Transistor T7 is thereby turned on. Transistor T6 is also turned on based on L-level signal SOUT. As a result, a pull-up current Ipu (Ipu-2) is supplied from keeper circuit 32e to the selected bit line BL. Transistor T8 of a keeper circuit is turned off.

Pull-up current Ipu-1 is supplied via one transistor, whereas pull-up current Ipu-2 is supplied via two transistors. Therefore, pull-up current Ipu-2 may be turned down in comparison with pull-up current Ipu-1. As a result, pull-up current Ipu-2 may be smaller than pull-up current Ipu-1. In other words, the current value of pull-up current Ipu-2 is smaller than the current value of pull-up current Ipu-1.

As described above, the pull-up current Ipu in the program verification operation (time T3 to time T4) for an H-data write is Ipu-1+Ipu-2 (Ipu-2<Ipu-1). Therefore, the pull-up current Ipu (Ipu-1+Ipu-2) in the program verification operation (time T3 to time T4) for an H-data write is larger than the pull-up current Ipu (Ipu-2) in the ordinary read operation.

Next, the pull-up current Ipu in the program verification operation (time T3 to time T4) for an L-data write will be described with reference to FIG. 11.

When L data is written, signal REN and signal SOUT are brought to the H level, and write data (Data) is brought to the L level, from time T3 to time T4. Inverter circuit 32k generates an H-level signal based on L-level write data (Data). NAND operation circuit 32j outputs an L-level signal based on the H-level signal REN and output signal of inverter circuit 32k. Transistor T8 is turned on based on the result (L-level signal) of NAND operation circuit 32j. Transistor T6 is also turned on based on L-level signal SOUT. Transistors T5 and T7 of keeper circuits are turned off. Consequently, a pull-up current Ipu (Ipu-3) is supplied from keeper circuits 32f and 32e to the selected bit line BL.

Pull-up current Ipu-3 is supplied via three transistors. Therefore, pull-up current Ipu-3 may be turned down in comparison with pull-up current Ipu-2. As a result, pull-up current Ipu-3 may be smaller than pull-up current Ipu-2. In other words, the current value of pull-up current Ipu-3 is smaller than the current value of pull-up current Ipu-2.

As described above, the pull-up current Ipu in the program verification operation (time T3 to time T4) for an L-data write is Ipu-3 (Ipu-3<Ipu-2). Therefore, the pull-up current Ipu (Ipu-3) in the program verification operation (time T3 to time T4) for an L-data write is smaller than the pull-up current Ipu (Ipu-2) in the ordinary read operation.

Returning to FIG. 7, the operation from time T3 to time T4 will be described.

When L data is written in the selected memory cell MC, the pull-down current Ipd is smaller than the pull-up current Ipu; therefore, the electrical potential of the bit line BL is maintained. When H data is written in the selected memory cell MC, the pull-down current Ipd is larger than the pull-up current Ipu; therefore, the electrical potential of the bit line BL is lowered.

[Time T4 to Time T5]

The word line driver 40 stops transferring the voltage of node N6 to the selected word line WL. The electrical potential of the selected word line WL is thereby brought to the L level.

The level shifter 32c generates output signal OUT based on the result of the sense amplifier 32b. Specifically, when L data is written in the selected memory cell MC, the sense amplifier 32b outputs L-level signal SOUT. Thus, the level shifter 32c outputs L-level signal OUT. When H data is written in the selected memory cell MC, the sense amplifier 32b outputs H-level signal SOUT. Thus, the level shifter 32c outputs H-level signal OUT.

Returning to FIG. 6, the steps subsequent to step S1002 will be described.

[Step S1003]

The control circuit 4 determines whether the program verification operation has been passed.

Specifically, with respect to an L-data write, the control circuit 4 determines that the program verification operation has been passed when determining the pull-up current Ipu is larger than the pull-down current Ipd. With respect to an H-data write, the control circuit 4 determines that the program verification operation has been passed when determining the pull-up current Ipu is smaller than the pull-down current Ipd. When the control circuit 4 determines that the program verification operation has been passed (YES in step S1003), the control circuit 4 terminates the write operation. When the control circuit 4 determines that the program verification operation has not been passed (NO in step S1003), the control circuit 4 repeats step S1001.

As described above, in the data determination (program verification operation) of a selected memory cell MC, the control circuit 4 varies the pull-up current Ipu in accordance with data being written in the selected memory cell MC.

Namely, when H data is being written in a selected memory cell MC, the control circuit 4 intentionally increases the pull-up current Ipu to make it difficult to pass the verification. The H-data write number is thereby increased, and the threshold distribution of H data can be moved down.

When L data is being written in a selected memory cell MC, the control circuit 4 intentionally decreases the pull-up current Ipu to make it difficult to pass the verification. The L-data write number is thereby increased, and the threshold distribution of L data can be moved up.

<1-3> Advantage

According to the above-described embodiment, in the program verification operation, the control circuit 4 varies the pull-up current Ipu in accordance with data being written in the selected memory cell MC. Therefore, the cell distribution margin can be increased without changing the word line electrical potential.

Figure 14:
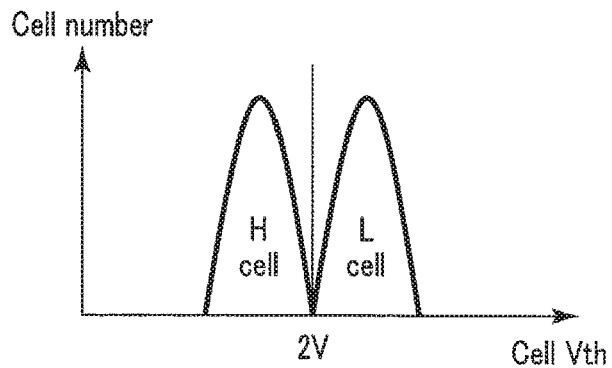
FIG. 14 shows a threshold distribution of memory cells of the semiconductor memory device according to the comparative example of the first embodiment.
Figure 15:
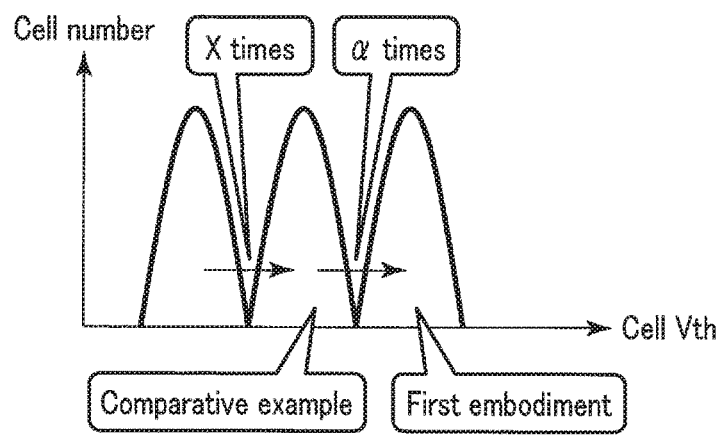
FIG. 15 is a diagram showing a relationship between threshold variations of memory cells by the write operations of the semiconductor memory device according to the first embodiment and threshold variations of memory cells by the write operations of the semiconductor memory device according to the comparative example of the first embodiment.
Figure 16:
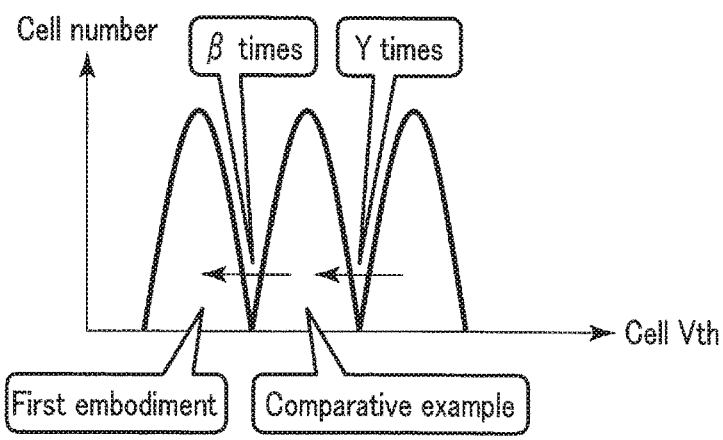
FIG. 16 is a diagram showing a relationship between threshold variations of memory cells by the write operations of the semiconductor memory device according to the first embodiment and threshold variations of memory cells by the write operations of the semiconductor memory device according to the comparative example of the first embodiment.

To facilitate understanding of the advantage, a comparative example will be described below with reference to FIGS. 12-16. FIG. 12 is a circuit diagram showing a basic configuration of the read circuit of the semiconductor memory device according to the comparative example of the first embodiment. FIG. 13 is a circuit diagram showing current paths of a pull-up current and a pull-down current of a case where a threshold of a memory cell is determined in the semiconductor memory device according to the comparative example of the first embodiment. In FIG. 13, structures not related to the pull-up current or the pull-down current are omitted. FIG. 14 shows a threshold distribution of memory cells of the semiconductor memory device according to the comparative example of the first embodiment. FIGS. 15 and 16 are diagrams showing a relationship between threshold variations of memory cells by the write operations of the semiconductor memory device according to the first embodiment and threshold variations of memory cells by the write operations of the semiconductor memory device according to the comparative example of the first embodiment.

As shown in FIG. 12, the read circuit 30 of the comparative example comprises a column selection circuit 31 and a sense circuit 32. The sense circuit 32 comprises a bit line precharge circuit 32a, a sense amplifier 32b, a level shifter 32c, and a keeper circuit 32e. The keeper circuit 32e is turned on when signal SOUT is at the L level.

A method for a data determination of a selected memory cell MC in the program verification operation of the comparative example will be described with reference to FIG. 13.

As shown in FIG. 13, signal SOUT is brought to the L-level in the program verification operation of the comparative example. Transistors T6 and T7 are thereby turned on. As a result, a pull-up current Ipu (Ipu-2) is supplied from the keeper circuit 32e to the selected bit line BL.

In this way, the program verification operation is performed with one type of pull-up current Ipu in the comparative example. In this case, as shown in FIG. 14, the threshold distribution of memory cells MC storing H data adjoins the threshold distribution of memory cells MC storing L data. However, in the case of distribution shown in FIG. 14, the threshold distribution of memory cells MC storing H data may overlap the threshold distribution of memory cells MC storing L data due to Vth variations caused by temperature changes and supply voltage variations. Therefore, it is preferable to secure a margin between the threshold distribution of memory cells MC storing H data and the threshold distribution of memory cells MC storing L data.

In the first embodiment, a margin is provided between the threshold distribution of memory cells MC storing H data and the threshold distribution of memory cells MC storing L data by adjusting the driving force of the pull-up current Ipu in the sense circuit 32 in accordance with data to be written.

For example, when L data is written in the comparative example, a determination is performed based on pull-up current Ipu (Ipu-2). Accordingly, the program operation is performed X (any integer) times in the comparative example, as shown in FIG. 15. In contrast, when L data is written in the first embodiment, a determination is performed based on pull-up current Ipu (Ipu-3). This pull-up current Ipu-3 is smaller than pull-up current Ipu-2. Thus, the program verification operation is more difficult to be passed in the first embodiment than in the comparative example. As a result, as shown in FIG. 15, the program operation is performed α (any integer) more times in the first embodiment than in the comparative example. Accordingly, the first embodiment can increase the L-data write number, and move up the threshold distribution of L data.

When H data is written in the comparative example, a determination is performed based on pull-up current Ipu (Ipu-2). Accordingly, the program operation is performed Y (any integer) times in the comparative example, as shown in FIG. 15. In contrast, when H data is written in the first embodiment, a determination is performed based on pull-up current Ipu (Ipu-1+Ipu-2). This pull-up current Ipu-1+Ipu-2 is larger than pull-up current Ipu-2. Thus, the program verification operation is more difficult to be passed in the first embodiment than in the comparative example. As a result, as shown in FIG. 15, the program operation is performed β (any integer) more times in the first embodiment than in the comparative example. Accordingly, the first embodiment can increase the H-data write number, and move down the threshold distribution of H data.

Thus, in the first embodiment, as shown in FIG. 5, a margin is secured between the threshold distribution of memory cells MC storing H data and the threshold distribution of memory cells MC storing L data.

As described above, the first embodiment can increase the distribution margin of memory cells MC without changing the word line electrical potential by adjusting the driving force of the pull-up current Ipu in the sense circuit 32 in accordance with data to be written.

<2> Second Embodiment

The second embodiment will be described. In the second embodiment, another example of the read circuit will be described. The basic configuration and basic operation of the device according to the second embodiment are the same as those of the device according to the above embodiment. Thus, descriptions of matters described in the above embodiment and matters easily inferable from the above embodiment will be omitted.

<2-1> Read Circuit

Figure 17:
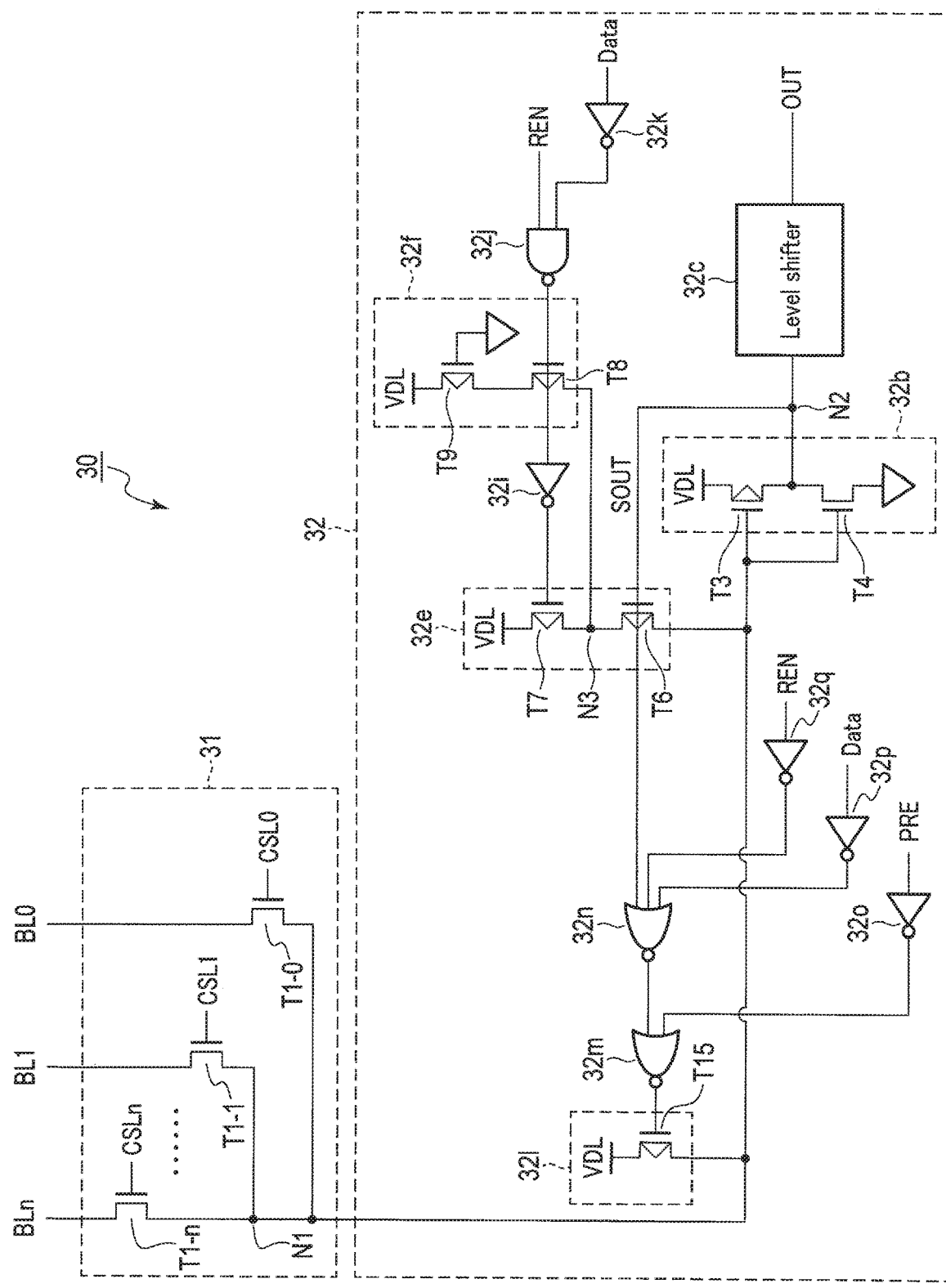
FIG. 17 is a circuit diagram showing a basic configuration of the read circuit of the semiconductor memory device according to the second embodiment.

Next, a circuit configuration of the read circuit 30 will be described with reference to FIG. 17. FIG. 17 is a circuit diagram showing a basic configuration of the read circuit of the semiconductor memory device according to the second embodiment.

As shown in FIG. 17, the read circuit 30 comprises a column selection circuit 31 and a sense circuit 32.

In the sense circuit 32 according to the second embodiment, the bit line precharge circuit and the keeper circuit described in relation to the sense circuit 32 according to the first embodiment are integrated. Specifically, the sense circuit 32 comprises a sense amplifier 32b, a level shifter 32c, keeper circuit 32e, keeper circuit 32f, inverter circuit 32i, a NAND operation circuit 32j, inverter circuit 32k, keeper circuit 32l, NOR operation circuit 32m, NOR operation circuit 32n, inverter circuit 32o, inverter circuit 32p, and inverter circuit 32q.

Inverter circuit 32o receives signal PRE, inverts it, and outputs the inverted signal.

Inverter circuit 32p receives write data (Data), inverts it, and outputs the inverted data.

Inverter circuit 32q receives signal REN, inverts it, and outputs the inverted signal.

NOR operation circuit 32n performs a NOR operation based on the output signals from inverter circuits 32p and 32q and signal SOUT.

NOR operation circuit 32m performs a NOR operation based on the output signal from inverter circuit 32o and the output signal from NOR operation circuit 32n.

Keeper circuit 32l functions as a bit line precharge circuit and a keeper circuit. Keeper circuit 32l comprises a PMOS transistor T15. One end of transistor T15 is supplied with voltage VDL, the other end is connected to node N1, and the gate is supplied with the output signal from NOR operation circuit 32m. For example, when a bit line is precharged, the control circuit 4 brings control signal PRE to the L level. Keeper circuit 32l thereby transfers voltage VDL to node N2. Keeper circuit 32l is turned on when signal SOUT is at the L level, and signal REN and write data (Data) are at the H level.

<2-2> Operation

The write operation of the semiconductor memory device according to the present embodiment will be described below. The basic operation is the same as the operation described in the first embodiment. For simplification, the operation of the second embodiment from time T3 to time T4 in FIG. 7 will be described.

[Time T3 to Time T4]

The word line driver 40 transfers the voltage of node N6 to a selected word line WL. The electrical potential of the selected word line WL is thereby brought to the H level. A data determination of the selected memory cell MC is thereby performed.

Figure 18:
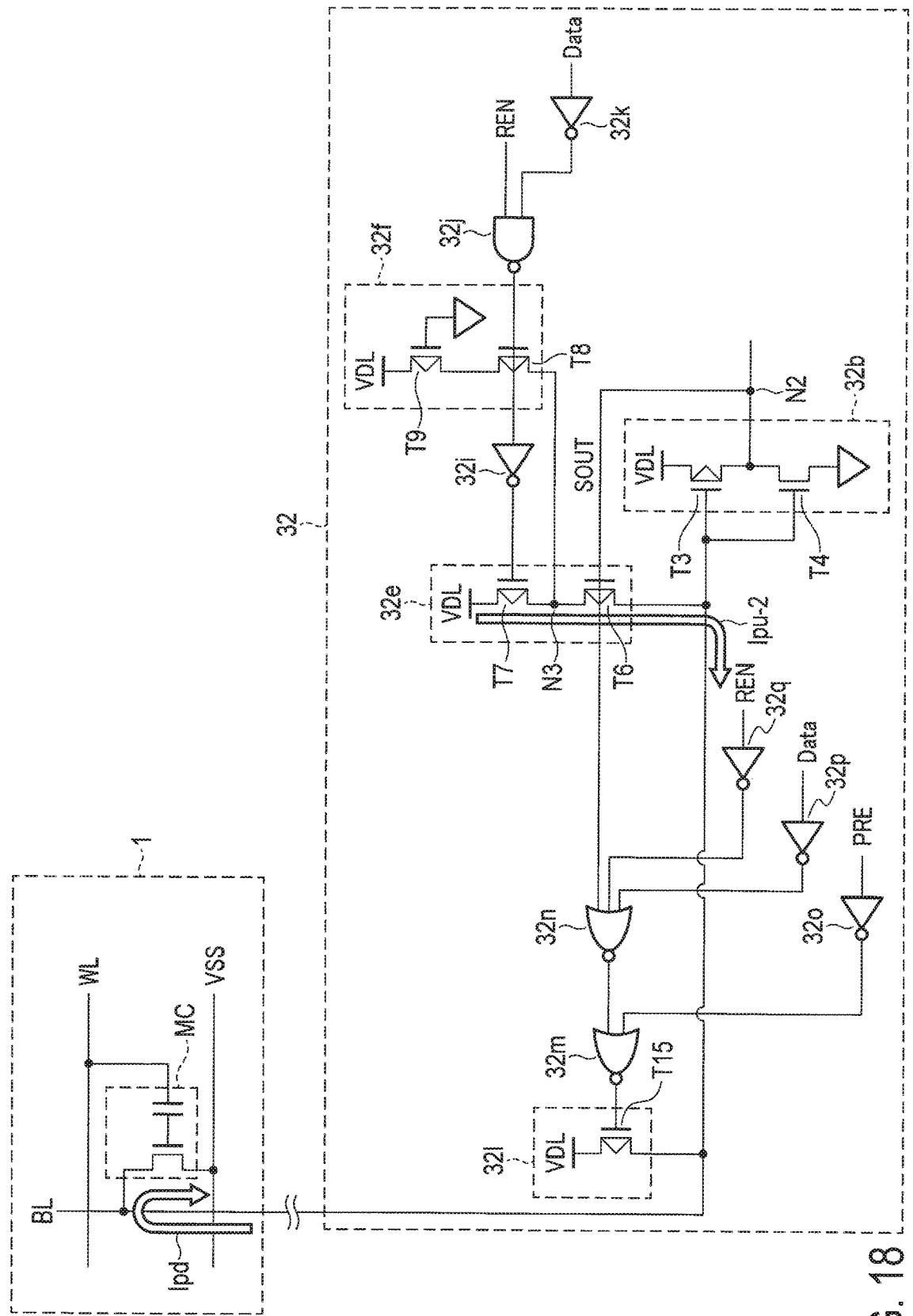
FIG. 18 is a circuit diagram showing current paths of a pull-up current and a pull-down current of a case where a threshold of a memory cell is determined in the semiconductor memory device according to the second embodiment.

A method for the data determination of the selected memory cell MC will be described with reference to FIGS. 18-20. FIGS. 18-20 are circuit diagrams showing current paths of a pull-up current and a pull-down current of a case where a threshold of a memory cell is determined in the semiconductor memory device according to the second embodiment. In FIGS. 18-20, structures not related to the pull-up current or the pull-down current are omitted.

Here, the pull-up current Ipu in the ordinary read operation, not the program verification operation, will be described with reference to FIG. 18. In the ordinary read operation, signal REN and write data (Data) are brought to the H level, and signal SOUT is brought to the L level. Inverter circuit 32k thereby generates an L-level signal based on the H-level write data (Data). NAND operation circuit 32j generates an H-level signal based on H-level signal REN and the L-level output signal of inverter circuit 32k. Inverter circuit 32i generates an L-level signal based on the H-level output signal of NAND operation circuit 32j. Transistor T7 is thereby turned on. Transistor T6 is also turned on based on L-level signal SOUT. As a result, a pull-up current Ipu (Ipu-2) is supplied from the keeper circuit 32e to the selected bit line BL. Transistors T15 and T8 of keeper circuits are turned off.

The pull-up current Ipu in the program verification operation (time T3 to time T4) for an H-data write will be described with reference to FIG. 19.

When H data is written, signal REN and write data (Data) are brought to the H level, and signal SOUT and signal PRE are brought to the L level, from time T3 to time T4. Inverter circuit 32p generates an L-level signal based on H-level write data (Data). Inverter circuit 32q generates an L-level signal based on H-level signal REN. NOR operation circuit 32n outputs an H-level signal based on the L-level output signals of inverter circuits 32p and 32q and signal SOUT. Inverter circuit 32o generates an H-level signal based on L-level signal PRE. NOR operation circuit 32m outputs an L-level signal based on the H-level output signals of NOR operation circuit 32n and inverter circuit 32o. Transistor T15 is turned on based on the result (L-level signal) of NOR operation circuit 32m. Consequently, a pull-up current Ipu (Ipu-1) is supplied from keeper circuit 32l to the selected bit line BL.

Inverter circuit 32k generates an L-level signal based on H-level write data (Data). NAND operation circuit 32j generates an H-level signal based on H-level signal REN and the L-level output signal of inverter circuit 32k. Inverter circuit 32i generates an L-level signal based on the H-level output signal of NAND operation circuit 32j. Transistor T7 is thereby turned on. Transistor T6 is also turned on based on L-level signal SOUT. As a result, a pull-up current Ipu (Ipu-2) is supplied from keeper circuit 32e to the selected bit line BL. Transistor T8 of a keeper circuit is turned off.

As described above, the pull-up current Ipu in the program verification operation (time T3 to time T4) for an H-data write is Ipu-1+Ipu-2 (Ipu-2<Ipu-1). Therefore, the pull-up current Ipu (Ipu-1+Ipu-2) in the program verification operation (time T3 to time T4) for an H-data write is larger than the pull-up current Ipu (Ipu-2) in the ordinary read operation.

Next, the pull-up current Ipu in the program verification operation (time T3 to time T4) for an L-data write will be described with reference to FIG. 20.

When L data is written, signal REN and signal SOUT are brought to the H level, and write data (Data) is brought to the L level, from time T3 to time T4. Inverter circuit 32k generates an H-level signal based on L-level write data (Data). NAND operation circuit 32j outputs an L-level signal based on H-level signal REN and the output signal of inverter circuit 32k. Transistor T8 is turned on based on the result (L-level signal) of NAND operation circuit 32j. Transistor T6 is also turned on based on L-level signal SOUT. Transistor T7 of a keeper circuit is turned off. Consequently, a pull-up current Ipu (Ipu-3) is supplied from keeper circuits 32f and 32e to the selected bit line BL.

Pull-up current Ipu-3 is supplied via three transistors. Therefore, pull-up current Ipu-3 may be turned down in comparison with pull-up current Ipu-2. As a result, pull-up current Ipu-3 may be smaller than pull-up current Ipu-2.

As described above, the pull-up current Ipu in the program verification operation (time T3 to time T4) for an L-data write is Ipu-3 (Ipu-3<Ipu-2). Therefore, the pull-up current Ipu (Ipu-3) in the program verification operation (time T3 to time T4) for an L-data write is smaller than the pull-up current Ipu (Ipu-2) in the ordinary read operation.

<2-3> Advantage

According to the above-described embodiment, the bit line precharge circuit is integrated with the keeper circuit. Even when the bit line precharge circuit is integrated with the keeper circuit, the same advantage as that of the first embodiment can be performed.

<3> Third Embodiment

The third embodiment will be described. In the third embodiment, another example of the word line driver will be described. The basic configuration and basic operation of the device according to the third embodiment are the same as those of the device according to the above embodiments. Thus, descriptions of matters described in the above embodiments and matters easily inferable from the above embodiments will be omitted.

<3-1> Word Line Driver

Next, a circuit configuration of the word line driver 40 will be described with reference to FIG. 21. FIG. 21 is a circuit diagram showing a basic configuration of the word line driver of the semiconductor memory device according to the third embodiment.

As shown in FIG. 21, the word line driver 40 comprises a level shifter 40a, inverter circuits 40b and 40c, NMOS transistors T11, T10, and T13, a PMOS transistor T12, and voltage generation circuits 41 and 42.

The voltage generation circuit 42 comprises a transfer gate 40e, a PMOS transistor T16, an NMOS transistor T17, and resistance elements R3, R4, and R5.

One end of transistor T16 is supplied with voltage VDD (for example, 5V), the other end is connected to one end of resistance element R3, and the gate is supplied with signal SEL2. Signal SEL2 is generated by, for example, the control circuit 4.

The other end of resistance element R3 is connected to node N8.

One end of resistance element R4 is connected to node N8, and the other end is connected to node N9.

One end of resistance element R5 is connected to node N9, and the other end is supplied with the ground voltage VSS.

One end of transistor T17 is connected to node N9, the other end is supplied with the ground voltage VSS, and the gate is supplied with write data (Data).

The transfer gate 40e transfers the voltage of node N8 to one end of transistor T13 in accordance with signal SEL2 and signal BSEL2 (inverted signal of signal SEL2).

The sense circuit 32 described in either of the first and second embodiments can be applied to the sense circuit 32 adopted in the third embodiment.

<3-2> Operation

The write operation of the semiconductor memory device according to the present embodiments will be described below. The basic operation is the same as the operation described in the first and second embodiments. For simplification, the operation of the third embodiment from time T3 to time T4 in FIG. 7 will be described. A description of the operation relating to the read circuit 30 will be omitted.

[Time T3 to Time T4]

The word line driver 40 transfers a desired voltage to a selected word line WL. The electrical potential of the selected word line WL is thereby brought to the H level. A data determination of the selected memory cell MC is thereby performed.

In the read operation or the verification operation, the word line driver 40 transfers the voltage of node N6 and the voltage of node N8 to the word line WL based on clock RCLK and signals SEL1, BSEL1, SEL2, and BSEL2. As a result, the word line driver 40 can supply the word line WL with, for example, voltages of different voltage values (1V to 3V) in the read operation or the verification operation.

Specifically, in the ordinary read operation, the control circuit 4 brings signal BSEL1 and signal SEL2 to the H level, and signal SEL1 and signal BSEL2 to the L level. Consequently, the transfer gate 40d and PMOS transistor T14 of the voltage generation circuit 41 are turned on. As a result, the word line driver 40 supplies a voltage (2V) from the voltage generation circuit 41 to the word line WL. The pull-down current Ipd flowing in the selected memory cell MC depends on the voltage supplied to the word line WL.

In the program verification operation (time T3 to time T4 in FIG. 7) for an H-data write, the control circuit 4 brings write data (Data) and signals SEL1 and BSEL2 to the H level, and signals BSEL1 and SEL2 to the L level. The transfer gate 40e, PMOS transistor T16 and NMOS transistor T17 of the voltage generation circuit 42 are thereby turned on. As a result, the word line driver 40 supplies a voltage (1V) from the voltage generation circuit 42 to the word line WL. The pull-down current Ipd flowing in the selected memory cell MC depends on the voltage supplied to the word line WL. Namely, the pull-down current Ipd in the program verification operation for an H-data write is larger than that in the ordinary read operation. Therefore, the program verification operation of an H-data write is more difficult to be passed than in the first embodiment.

In the program verification operation (time T3 to time T4 in FIG. 7) for an L-data write, signal BSEL2 is brought to the H level, and write data (Data) and signal SEL2 are brought to the L level. Consequently, the transfer gate 40*e* and PMOS transistor T16 of the voltage generation circuit 42 are turned on. As a result, the word line driver 40 supplies a voltage (3V) from the voltage generation circuit 42 to the word line WL. The pull-down current Ipd flowing in the selected memory cell MC depends on the voltage supplied to the word line WL. Namely, the pull-down current Ipd in the program verification operation for an L-data write is smaller than that in the ordinary read operation. Therefore, the program verification operation of an L-data write is more difficult to be passed than in the second embodiment.

<3-3> Advantage

According to the above-described embodiment, in the program verification operation, the word line driver 40 varies the pull-down current Ipd in accordance with data written in the selected memory cell MC. Then, the pull-up current Ipu is varied in accordance with data written in the selected memory cell MC by using the sense circuit 32 described in the first and second embodiments. Therefore, the third embodiment can increase the distribution margin of memory cells MC in comparison with the first and second embodiments.

<4> Fourth Embodiment

The fourth embodiment will be described. In the fourth embodiment, another example of the read circuit will be described. The basic configuration and basic operation of the device according to the fourth embodiment are the same as those of the device according to the above embodiments. Thus, descriptions of matters described in the above embodiments and matters easily inferable from the above embodiments will be omitted.

<4-1> Read Circuit

Next, a circuit configuration of the read circuit 30 will be described with reference to FIG. 22. FIG. 22 is a circuit diagram showing a basic configuration of the read circuit of the semiconductor memory device according to the fourth embodiment.

As shown in FIG. 22, the read circuit 30 comprises a column selection circuit 31 and a sense circuit 32.

The sense circuit 32 according to the fourth embodiment does not have structures for generating pull-up current Ipu-1 described in relation to the sense circuit 32 according to the first embodiment. Specifically, the sense circuit 32 comprises a bit line precharge circuit 32*a*, a sense amplifier 32*b*, a level shifter 32*c*, keeper circuit 32*e*, keeper circuit 32*f*, inverter circuit 32*i*, a NAND operation circuit 32*j*, and inverter circuit 32*k*.

The word line driver 40 described in either of the first and third embodiments can be applied to the word line driver 40 adopted in the fourth embodiment.

<4-2> Operation

The write operation of the semiconductor memory device according to the present embodiment will be described below. The basic operation is the same as the operation described in the first embodiment. For simplification, the operation of the fourth embodiment from time T3 to time T4 in FIG. 7 will be described.

[Time T3 to Time T4]

The word line driver 40 transfers a desired voltage to a selected word line WL. The electrical potential of the selected word line WL is thereby brought to the H level. A data determination of the selected memory cell MC is thereby performed.

A method for a data determination of a selected memory cell MC will be described with reference to FIGS. 23 and 24.

Figure 23:
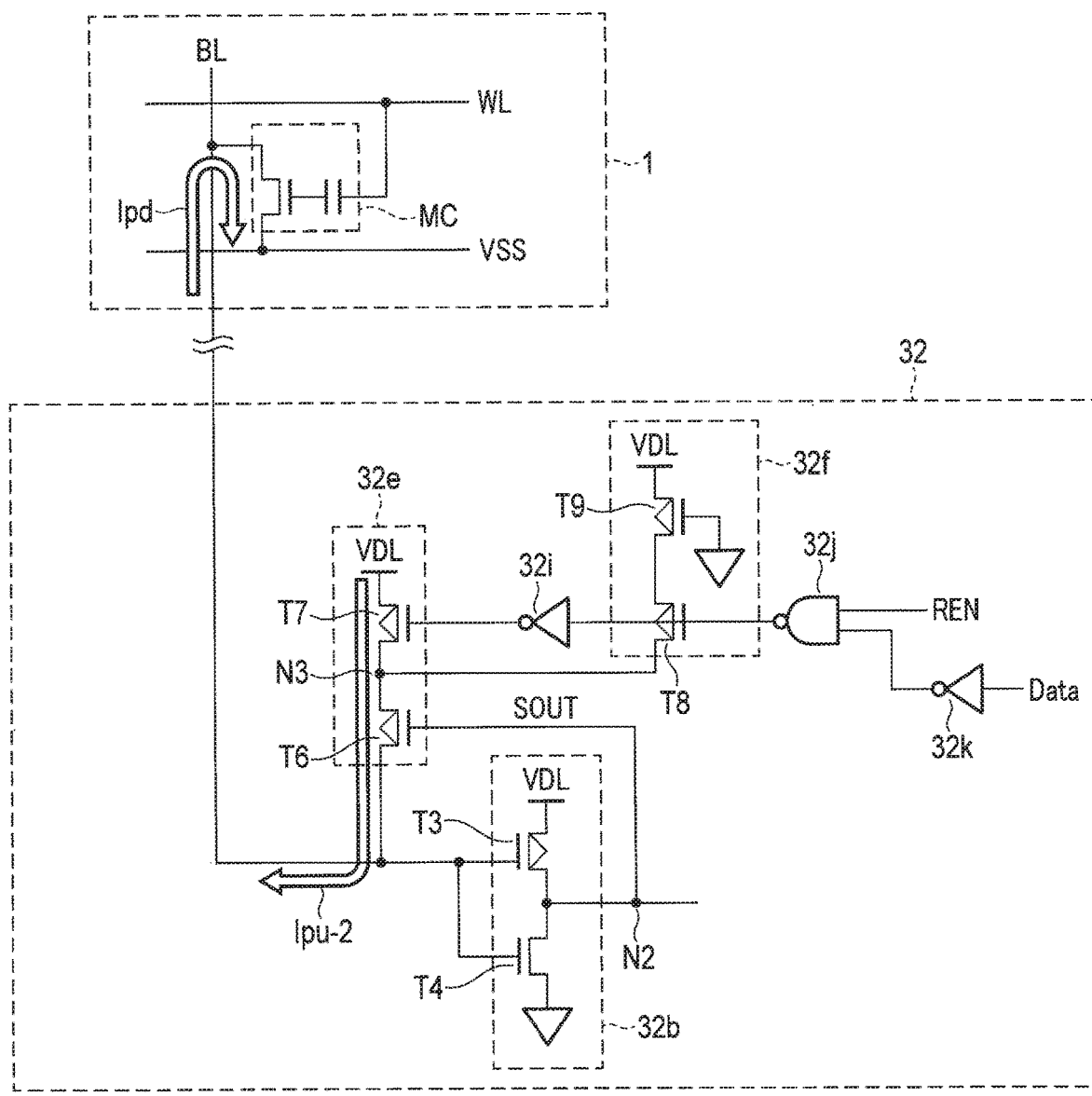
FIG. 23 is a circuit diagram showing current paths of a pull-up current and a pull-down current of a case where a threshold of a memory cell is determined in the semiconductor memory device according to the fourth embodiment.

FIGS. 23 and 24 are circuit diagrams showing current paths of a pull-up current and a pull-down current of a case where a threshold of a memory cell is determined in the semiconductor memory device according to the fourth embodiment. In FIGS. 23 and 24, structures not related to the pull-up current or the pull-down current are omitted.

Here, the pull-up current Ipu in the ordinary read operation, or the program verification operation for an H-data write will be described with reference to FIG. 23. In the ordinary read operation, or the program verification operation for an H-data write, signal REN and write data (Data) are brought to the H level, and signal SOUT is brought to the L level. Inverter circuit 32*k* thereby generates an L-level signal based on the H-level write data (Data). NAND operation circuit 32*j* generates an H-level signal based on H-level signal REN and the L-level signal. Inverter circuit 32*i* generates an L-level signal based on the output signal of NAND operation circuit 32*j*. Transistor T7 is thereby turned on. Transistor T6 is also turned on based on L-level signal SOUT. As a result, a pull-up current Ipu (Ipu-2) is supplied from keeper circuit 32*e* to the selected bit line BL. Transistor T8 of a keeper circuit is turned off (brought out of conductance).

Next, the pull-up current Ipu in the program verification operation (time T3 to time T4) for an L-data write will be described with reference to FIG. 24.

When L data is written, signal REN and signal SOUT are brought to the H level, and write data (Data) is brought to the L level, from time T3 to time T4. Inverter circuit 32*k* generates an H-level signal based on L-level write data (Data). NAND operation circuit 32*j* outputs an L-level signal based on the H-level signal REN and output signal of inverter circuit 32*k*. Transistor T8 is turned on based on the result (L-level signal) of NAND operation circuit 32*j*. Transistor T6 is also turned on based on L-level signal SOUT. Transistor T7 of a keeper circuit is turned off. Consequently, a pull-up current Ipu (Ipu-3) is supplied from keeper circuits 32*f* and 32*e* to the selected bit line BL.

Pull-up current Ipu-3 is supplied via three transistors. Therefore, pull-up current Ipu-3 may be turned down in comparison with pull-up current Ipu-2. As a result, pull-up current Ipu-3 may be smaller than pull-up current Ipu-2.

As described above, the pull-up current Ipu in the program verification operation (time T3 to time T4) for an L-data write is Ipu-3 (Ipu-3<Ipu-2). Therefore, the pull-up current Ipu (Ipu-3) in the program verification operation (time T3 to time T4) for an L-data write is smaller than the pull-up current Ipu (Ipu-2) in the ordinary read operation or the program verification operation for an H-data write.

<4-3> Advantage

According to the above-described embodiment, the sense circuit 32 does not have structures for generating pull-up current Ipu-1 described in relation to the sense circuit 32 according to the first embodiment. Therefore, the threshold distribution of memory cells MC storing H data cannot be moved down in comparison with the first to third embodiments. However, the threshold distribution of memory cells MC storing L data can be moved up as in the first to third embodiments. Therefore, the fourth embodiment can increase the distribution margin of memory cells MC in comparison with the comparative example of the first embodiment.

By applying the word line driver 40 described in the third embodiment, the distribution margin of memory cells MC can be increased in comparison with the case where the word line driver 40 described in the first embodiment is applied.

<5> Fifth Embodiment

The fifth embodiment will be described. In the fifth embodiment, another example of the read circuit will be described. The basic configuration and basic operation of the device according to the fifth embodiment are the same as those of the device according to the above embodiments. Thus, descriptions of matters described in the above embodiments and matters easily inferable from the above embodiments will be omitted.

<5-1> Read Circuit

Next, a circuit configuration of the read circuit 30 will be described with reference to FIG. 25. FIG. 25 is a circuit diagram showing a basic configuration of the read circuit of the semiconductor memory device according to the fifth embodiment.

As shown in FIG. 25, the read circuit 30 comprises a column selection circuit 31 and a sense circuit 32.

The sense circuit 32 according to the fifth embodiment does not have structures for generating pull-up current Ipu-3 described in relation to the sense circuit 32 according to the first embodiment. Specifically, the sense circuit 32 comprises a bit line precharge circuit 32a, a sense amplifier 32b, a level shifter 32c, keeper circuit 32d, keeper circuit 32e, NAND operation circuit 32g, inverter circuit 32h, inverter circuit 32i, and NAND operation circuit 32j.

The word line driver 40 described in either of the first and third embodiments can be applied to the word line driver 40 adopted in the fifth embodiment.

<5-2> Operation

The write operation of the semiconductor memory device according to the present embodiment will be described below. The basic operation is the same as the operation described in the first embodiment. For simplification, the operation of the fifth embodiment from time T3 to time T4 in FIG. 7 will be described.

[Time T3 to Time T4]

The word line driver 40 transfers a desired voltage to a selected word line WL. The electrical potential of the selected word line WL is thereby brought to the H level. A data determination of the selected memory cell MC is thereby performed.

Figure 27:
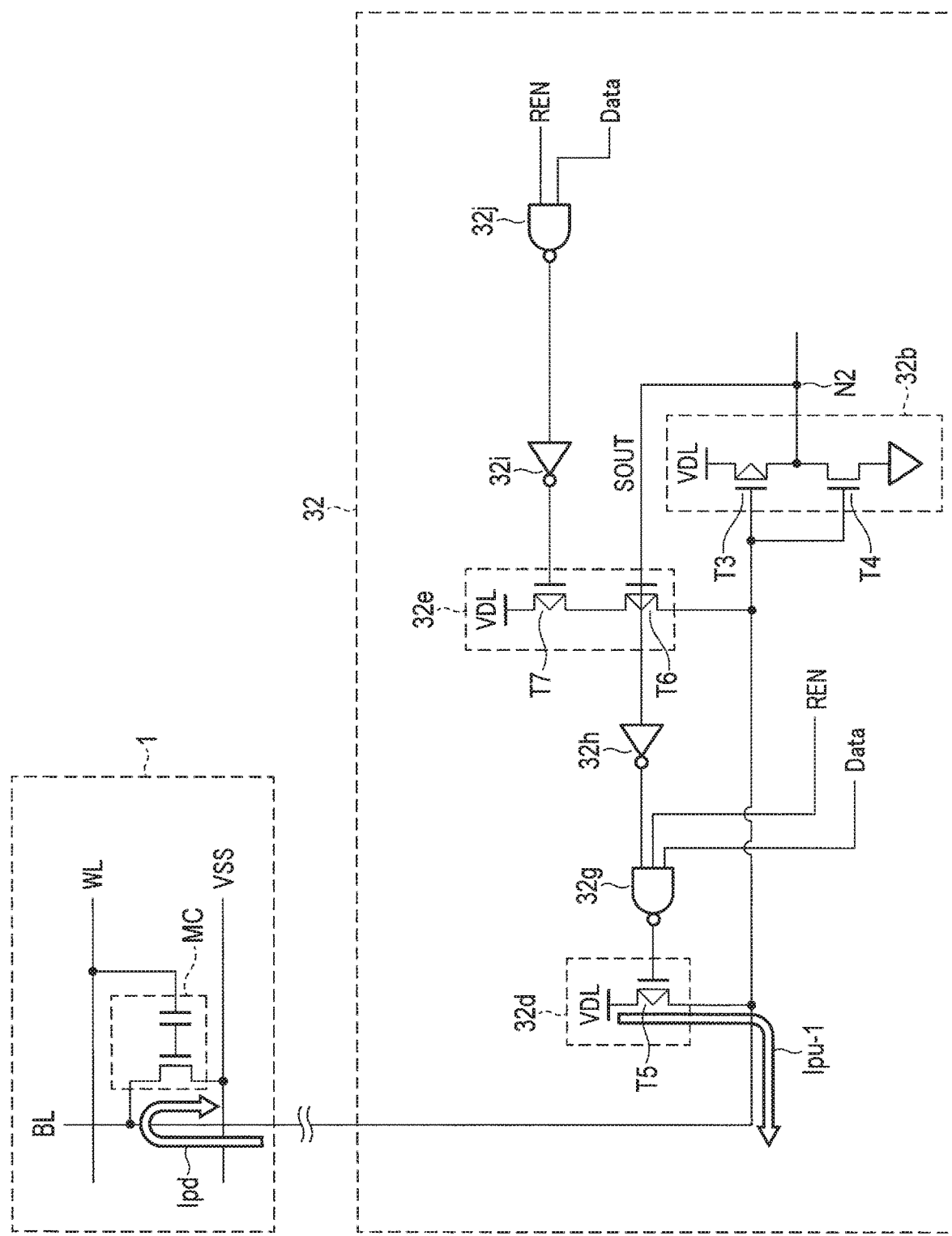
FIG. 27 is a circuit diagram showing current paths of a pull-up current and a pull-down current of a case where a threshold of a memory cell is determined in the semiconductor memory device according to the fifth embodiment.

A method for the data determination of the selected memory cell MC will be described with reference to FIGS. 26 and 27. FIGS. 26 and 27 are circuit diagrams showing current paths of a pull-up current and a pull-down current of a case where a threshold of a memory cell is determined in the semiconductor memory device according to the fifth embodiment. In FIGS. 26 and 27, structures not related to the pull-up current or the pull-down current are omitted.

Here, the pull-up current Ipu in the ordinary read operation, or the program verification operation for an L-data write will be described with reference to FIG. 26. In the ordinary read operation, or the program verification operation for an L-data write, signal REN is brought to the H level, and signal SOUT and write data (Data) are brought to the L level. NAND operation circuit 32j thereby generates an H-level signal. Inverter circuit 32i generates an L-level signal based on the H-level signal received from NAND operation circuit 32j. Transistor T7 is thereby turned on. Transistor T6 is also turned on based on L-level signal SOUT. As a result, a pull-up current Ipu (Ipu-2) is supplied from keeper circuit 32e to the selected bit line BL. Transistor T5 of the other keeper circuit is turned off.

Next, the pull-up current Ipu in the program verification operation (time T3 to time T4) for an H-data write will be described with reference to FIG. 27.

When H data is written, signal REN and write data (Data) are brought to the H level, and signal SOUT is brought to the L level, from time T3 to time T4. Inverter circuit 32h generates an H-level signal based on L-level signal SOUT. NAND operation circuit 32g outputs an L-level signal based on the H-level signal REN, write data (Data), and output signal of inverter circuit 32h. Transistor T5 is turned on based on the result (L-level signal) of NAND operation circuit 32g. Consequently, a pull-up current Ipu (Ipu-1) is supplied from keeper circuit 32d to the selected bit line BL.

NAND operation circuit 32j generates an L-level signal based on H-level write data (Data) and signal REN. Inverter circuit 32i generates an H-level signal based on the L-level signal. Transistor T7 is thereby turned off.

Pull-up current Ipu-1 is supplied via one transistor, whereas pull-up current Ipu-2 is supplied via two transistors. Therefore, pull-up current Ipu-2 may be turned down in comparison with pull-up current Ipu-1. As a result, pull-up current Ipu-2 may be smaller than pull-up current Ipu-1.

As described above, the pull-up current Ipu in the program verification operation (time T3 to time T4) for an H-data write is Ipu-1. Therefore, the pull-up current Ipu (Ipu-1) in the program verification operation (time T3 to time T4) for an H-data write is larger than the pull-up current Ipu (Ipu-2) in the ordinary read operation.

<5-3> Advantage

According to the above-described embodiment, the sense circuit 32 does not have structures for generating pull-up current Ipu-3 described in relation to the sense circuit 32 according to the first embodiment. Therefore, the threshold distribution of memory cells MC storing L data cannot be moved up in comparison with the first to third embodiments. However, the threshold distribution of memory cells MC storing H data can be moved down as in the first to third embodiments. Therefore, the fifth embodiment can increase the distribution margin of memory cells MC in comparison with the first embodiment.

By applying the word line driver 40 described in the third embodiment, the distribution margin of memory cells MC can be increased in comparison with the case where the word line driver 40 described in the first embodiment is applied.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell that stores data;
   a first circuit that determines data stored in the memory cell;
   a second circuit that controls the first circuit; and
   a bit line connecting the memory cell to the first circuit, wherein;
   in a sequence of writing first data in the memory cell,
   the second circuit performs a program operation to store the first data in the memory cell, and the first circuit performs a program verification operation to determine whether the first data has been stored in the memory cell based on a second current flowing in the memory cell via the bit line and a first current of a first value flowing in the bit line, and in a sequence of writing second data different from the first data in the memory cell, the second circuit performs a program operation to store the second data in the memory cell, and the first circuit performs a program verification operation to determine whether the second data has been stored in the memory cell based on a fourth current flowing in the memory cell via the bit line and a third current of a second value different from the first value flowing in the bit line.

2. The semiconductor memory device of claim 1, wherein the first circuit generates the first current when receiving the first data, and generates the third current when receiving the second data.

3. The semiconductor memory device of claim 1, wherein the first circuit comprises a first current generation circuit that generates the first current, and a second current generation circuit that generates the third current.

4. The semiconductor memory device of claim 1, wherein the first circuit turns on a first number of transistors when receiving the first data, and turns on a second number of transistors when receiving the second data, the second number being different from the first number.

5. The semiconductor memory device of claim 1, further comprising a third circuit that supplies a voltage to a word line connected to the memory cell, wherein:

the first circuit determines data via a bit line of the memory cell, in the sequence of writing first data in the memory cell, the third circuit supplies a voltage of a first voltage value to the word line, and in the sequence of writing second data in the memory cell, the third circuit supplies a voltage of a second voltage value different from the first voltage value to the word line.

6. The semiconductor memory device of claim 1, wherein:

the memory cell comprises a transistor and a capacitor, one end of the transistor is connected to the bit line, another end of the transistor is supplied with a ground voltage, and a gate of the transistor is connected to a first electrode of the capacitor, and a second electrode of the capacitor is connected to a word line.

7. The semiconductor memory device of claim 6, wherein the first circuit feeds the first current or the third current to the bit line.

8. The semiconductor memory device of claim 1, wherein when reading data from the memory cell, the first circuit generates a fifth current of a third value different from the first value and the second value, and determines data stored in the memory cell based on the fifth current and a current flowing in the memory cell at a time of the read.

9. The semiconductor memory device of claim 1, wherein when reading data from the memory cell, the first circuit generates the first current, and determines data stored in the memory cell based on the first current and a current flowing in the memory cell at a time of the read.

10. The semiconductor memory device of claim 1, wherein:

the first circuit generates the first current or the third current in the program verification operation.

11. The semiconductor memory device of claim 10, wherein the first circuit:

charges the bit line in which the first current or the third current flows, prior to the program verification operation, and performs the program verification operation after charging the bit line.

12. The semiconductor memory device of claim 11, wherein the first circuit comprises a charge circuit that charges the bit line of the memory cell.

13. The semiconductor memory device of claim 12, wherein:

the first circuit comprises a first current generation circuit that generates the first current, and a second current generation circuit that generates the third current, and the first current generation circuit charges the bit line of the memory cell prior to the program verification operation.

14. The semiconductor memory device of claim 1, wherein when a threshold of the memory cell storing the first data is smaller than a threshold of the memory cell storing the second data, the first circuit makes the first value larger than the second value.

15. The semiconductor memory device of claim 14, wherein:

when the first data is written in the memory cell, the second current becomes larger than the first current, and an electrical potential of a bit line falls, and when the second data is written in the memory cell, the fourth current becomes smaller than the third current, and the electrical potential of the bit line is maintained.

16. The semiconductor memory device of claim 14, wherein the first circuit turns on a first number of transistors when receiving the first data, and turns on a second number of transistors when receiving the second data, the second number being larger than the first number.

17. The semiconductor memory device of claim 14, wherein when reading data from the memory cell, the first circuit generates a fifth current of a third value smaller than the first value and larger than the second value, and determines data stored in the memory cell based on the fifth current and a current flowing in the memory cell at a time of the read.

18. The semiconductor memory device of claim 1, wherein the second circuit:

repeats the sequence of writing the first data in the memory cell, when the first circuit determines that the first data is not stored in the memory cell in the sequence of writing the first data in the memory cell, and repeats the sequence of writing the second data in the memory cell, when the first circuit determines that the second data is not stored in the memory cell in the sequence of writing second data in the memory cell.

19. The semiconductor memory device of claim 1, wherein the memory cell is a data-rewritable multiple time programmable (MTP) memory.

* * * * *